(12) United States Patent
Adamski et al.

(10) Patent No.: US 11,624,762 B2
(45) Date of Patent: Apr. 11, 2023

(54) PHASE-CHANGE MATERIAL SWITCHES

(71) Applicant: pSemi Corporation, San Diego, CA (US)

(72) Inventors: Jaroslaw Adamski, Steamwood, IL (US); Jeffrey A. Dykstra, Woodstock, IL (US); Edward Nicholas Comfoltey, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 28 days.

(21) Appl. No.: 17/351,651

(22) Filed: Jun. 18, 2021

(65) Prior Publication Data
US 2022/0404406 A1  Dec. 22, 2022

(51) Int. Cl.
*G01R 27/08* (2006.01)
*H01L 45/00* (2006.01)

(52) U.S. Cl.
CPC .......... *G01R 27/08* (2013.01); *H01L 45/128* (2013.01)

(58) Field of Classification Search
CPC ........ G01R 27/00; G01R 21/02; G01R 27/08; H01L 45/00; H01L 45/04; H01L 45/12; H01L 45/128
USPC ................ 324/500, 512, 525, 600, 649, 691
See application file for complete search history.

(56) References Cited

U.S. PATENT DOCUMENTS

| | | | |
|---|---|---|---|
| 6,565,176 B2 * | 5/2003 | Anderson | ............ B41J 2/04506 347/14 |
| 8,848,436 B2 * | 9/2014 | Manaka | ................ H01L 45/128 365/163 |
| 9,257,647 B2 | 2/2016 | Borodulin et al. | |
| 9,368,720 B1 | 6/2016 | Moon et al. | |
| 9,647,209 B2 | 5/2017 | Goktepeli et al. | |
| 10,700,270 B2 * | 6/2020 | Borodulin | ............. H01L 45/144 |
| 2003/0016258 A1 * | 1/2003 | Anderson | .............. B41J 2/0458 347/14 |
| 2014/0264230 A1 * | 9/2014 | Borodulin | ........... H01L 45/1226 257/4 |
| 2016/0028007 A1 | 1/2016 | Borodulin | |

(Continued)

OTHER PUBLICATIONS

Adamski, et al., "Phase-Change Material Switches with Isolated Heating Elements", provisional application filed in the USPTO on Jun. 18, 2021, U.S. Appl. No. 63/212,298, 55 pgs.

(Continued)

*Primary Examiner* — Hoai-An D. Nguyen
(74) *Attorney, Agent, or Firm* — Jaquez Land Greenhaus & McFarland LLP; John Land, Esq.

(57) ABSTRACT

Circuits and methods that enable stacking of phase change material (PCM) switches and that accommodate variations in the resistance of the resistive heater(s) of such switches. Stacking is enabled by providing isolation switches for the resistive heater(s) in a PCM switch to reduce parasitic capacitance caused by the proximity of the resistive heater(s) to the PCM region of a PCM switch. Variations in the resistance of the resistive heater(s) of a PCM switch are mitigated or eliminated by sensing the actual resistance of the resistive heater(s) and then determining a suitable adjusted electrical pulse profile for the resistive heater(s) that generates a precise thermal pulse to the PCM region, thereby reliably achieving a desired switch state while extending the life of the resistive heater(s) and the phase-change material.

23 Claims, 20 Drawing Sheets

(56) References Cited

U.S. PATENT DOCUMENTS

| | | | |
|---|---|---|---|
| 2017/0365427 A1* | 12/2017 | Borodulin | H01L 45/1286 |
| 2018/0106686 A1* | 4/2018 | Furtner | G01K 7/16 |
| 2019/0286029 A1* | 9/2019 | Adachi | G03G 15/2053 |
| 2020/0058354 A1 | 2/2020 | Slovin | |
| 2020/0059217 A1 | 2/2020 | Masse et al. | |
| 2020/0266715 A1* | 8/2020 | Ness | G01R 19/0092 |
| 2020/0337758 A1* | 10/2020 | Ebata | A61B 18/10 |
| 2022/0406997 A1 | 12/2022 | Adamski et al. | |

OTHER PUBLICATIONS

El-Hinnawy, et al., "A Four-Terminal, Inline, Chalcogenide Phase-Change RF Switch Using an Independent Resistive Heater for Thermal Actuation", IEEE Electron Device Letters, vol. 34, No. 10, Oct. 2013, pp. 1313-1315.

Young, et al. "Improvement in GeTe-based Phase Changes RF Switches". 2018 IEEE, 2018 IEEE/MIT-S International Microwave Symposium, pp. 832-835.

Slovin, et al., "Monolithic Integration of Phase-Change RF Switches in a Production SiGe BiCMOS Process with RF Circuit Demonstrations", 2020 IEEE, 2020 IEEE/MIT-2 International Microwave Symposium, pp. 57-60.

El-Hinnawy, et al., "A 25 THz FCO (6.3 fs RON*COFF) Phase-Change Material RF Switch Fabricated in a High Volume Manufacturing Environment with Demonstrated Cycling >1 Billion Times", 2020 IEEE, 2020 IEEE/MIT-S International Microwave Symposium, pp. 45-48.

Shim, et al. "RF Switches using Phase Change Materials", MEMS 2013, Taipei, Taiwan, Jan. 20-24, 2013, pp. 237-240.

Baltimas, et al., "A 25-50 GHz Change Materials (PCM) 5-Bit True Time Delay Phase Shifter in a Production SiGe BiCMOS Process", 2021 IEEE/MTT-S International Microwave Symposium, pp. 435-437.

Shukla, et al., "An Overview of Thermal Challenges and Opportunities for Monolithic 3D ICs", GLSVLSI, May 9-11, 2019, 6 pgs.

Angermeier, Detlef, International Search Report and Written Opinion received from the EPO dated Nov. 17, 22 for appln. no. PCT/US2022/031477, 10 pgs.

* cited by examiner

*1300*

*1400*

PHASE-CHANGE MATERIAL SWITCHES

CROSS-REFERENCE TO RELATED APPLICATIONS

This invention may be related to the following patent applications, all assigned to the assignee of the present invention, the contents of all of which are incorporated by reference:

U.S. patent application Ser. No. 63/212,298, filed concurrently with the present application, entitled "Phase-Change Material Switches with Isolated Heating Elements".

BACKGROUND

(1) Technical Field

This invention relates to electronic circuitry, and more particularly to phase change material (PCM) switches.

(2) Background

Phase-change materials have been used to fabricate integrated circuit (IC) switches that can be thermally transitioned between a high-resistivity amorphous OFF state (e.g., having a resistivity ρ of about 10 Ω-m) and a low-resistivity crystalline ON state (e.g., having a resistivity ρ of less than about 2 μΩ-m). A PCM switch consists of a volume of phase-change material (PCM) having two electrical terminals and an adjacent heater, such as a resistor.

FIG. 1A is a diagram of a prior art electrical symbol 100 for a PCM switch, and an equivalent single-pole, single-throw switch symbol. The electrical symbol 100 stylistically shows a region of PCM 102 (marked with a "delta" symbol to indicate "change") and an adjacent heater, which is generally a resistive heater $R_H$. Precisely controlled electrical power profiles are applied to the resistive heater $R_H$ to generate different thermal profiles that result either in amorphizing the PCM region 102 into a high resistance state (OFF or open) using a higher-power, short-period pulse, or crystalizing the PCM region 102 into a low resistance state (ON or closed) using a lower-power, long-period pulse.

FIG. 1B is a stylized cross-sectional view of a portion of an IC showing the physical structure of a PCM switch 110. Within an insulating layer 112, a region of PCM 114 is formed and connected to two electrical contacts (e.g., vias) 116. At least one resistive heater 118 is formed in close enough proximity to the PCM region 114 to be able to either amorphize or crystalize the PCM region 114; in the illustrated example, two resistive heaters 118 are shown. Not shown are electrical contacts to the resistive heaters 118 which may be coupled to a driver circuit that is controlled to provide different power profiles corresponding to the different thermal profiles required to switch the resistivity states of the PCM region 114.

FIG. 2A is an example of two different power profiles for switching the resistivity states of the PCM region 114 of FIG. 1B. FIG. 2B is an example of the corresponding thermal profiles that cause switching of the resistivity states of the PCM region 114 of FIG. 1B.

Referring to both FIGS. 2A and 2B, in order to place the PCM switch 110 of FIG. 1B in an OFF state, a higher-power, short-period electrical pulse 202 is applied to the resistive heaters 118. The electrical pulse 202 provides a power level sufficient to cause the temperature profile of the PCM region 114 to rapidly increase above a melting temperature Tm for the selected phase-change material, resulting in a thermal profile 204 for the PCM region 114 that exhibits a rapid increase and then decrease in temperature.

Again referring to both FIGS. 2A and 2B, in order to place the PCM switch 110 of FIG. 1B in an ON state, a lower-power, long-period electrical pulse 206 is applied to the resistive heaters 118. The electrical pulse 206 provides a power level sufficient to cause the temperature profile of the PCM region 114 to increase above a crystallization (or recrystallization) temperature Tc (but remain less than Tm) for the selected phase-change material for a longer period of time, resulting in a thermal profile 208 for the PCM region 114 that exhibits a slower, lower, and longer increase in temperature compared to the OFF state thermal profile 204. The ON state electrical pulse 206 may be, for example, about 10 times longer than the OFF state electrical pulse 202 (e.g., ~1000 ns versus ~100 ns).

PCM switches are fast, non-volatile, have a relatively small form factor, and can be readily integrated with CMOS electronics. As such, they have a great potential for implementing high-speed RF switch devices. However, PCM switches are not without drawbacks.

A first problem is that PCM switches cannot be readily "stacked" in series to handle high voltages without creating an undesired uneven voltage division between the PCM switches in the stack, which can lead to device failure.

A second problem is the resistance of the resistive heater(s) $R_H$ is prone to significant manufacturing variations (e.g., up to 50%) and also varies with temperature (both environmental and self-induced), which translates to large variations of the delivered power to the PCM region 114. This may result in unreliable switching, premature wearing of the resistive heater(s) $R_H$, and/or degradation of the phase-change material.

Accordingly, there is a need for PCM switch circuits and methods that enable stacking of PCM switches and that accommodate variations in the resistance of the resistive heater(s) of such switches. The present invention addresses this need.

SUMMARY

The present invention encompasses circuits and methods that enable stacking of phase change material (PCM) switches and that accommodate variations in the resistance of the resistive heater(s) of such switches. Stacking is enabled by providing isolation switches for the resistive heater(s) in a PCM switch to reduce parasitic capacitance caused by the proximity of the resistive heater(s) to the PCM region of a PCM switch. Variations in the resistance of the resistive heater(s) of a PCM switch are mitigated or eliminated by sensing the actual resistance of the resistive heater(s) and then determining a suitable adjusted electrical pulse profile for the resistive heater(s) that generates a precise thermal pulse to the PCM region, thereby reliably achieving a desired switch state while extending the life of the resistive heater(s) and the phase-change material.

One embodiment encompasses a phase change material (PCM) switch including: a PCM region having an input and an output; a resistive heater adjacent the PCM region and having a first terminal and a second terminal; a first switch coupled to the first terminal of the resistive heater; and a second switch coupled to the second terminal of the resistive heater. Another embodiment encompasses a stack of two or more phase change material (PCM) switches having respective PCM regions coupled in series and resistive heaters configured to be electrically isolated while an electrical pulse profile is not to be applied to the resistive heaters.

Another embodiment encompasses a phase change material (PCM) switch including: a PCM region having an input and an output; a resistive heater adjacent the PCM region and having a first terminal and a second terminal; a first inductor coupled to the first terminal of the resistive heater; and a second inductor coupled to the second terminal of the resistive heater.

Another aspect of the invention includes methods for reducing parasitic capacitance caused by the proximity of a resistive heater to a phase change material (PCM) region of a PCM switch by electrically isolating the resistive heater while an electrical pulse profile is not to be applied to the resistive heater.

Yet another aspect of the invention includes methods for countering variations in resistance of a resistive heater of a phase change material (PCM) switch, including: measuring a resistance $R_{H\_M}$ of the resistive heater; calculating scaled current, voltage, and/or time values as a function of the measured resistance $R_{H\_M}$ and a reference resistance $R_{H\_REF}$; calculating an adjusted electrical pulse profile based on the calculated scaled values; and applying the adjusted electrical pulse profile to the resistive heater.

Still another aspect of the invention includes circuits for countering variations in resistance of a resistive heater of a phase change material (PCM) switch, including: a resistivity sensor for measuring a resistance $R_{H\_M}$ of the resistive heater; a processor, coupled to the resistivity sensor, for calculating scaled current, voltage, and/or time values as a function of the measured resistance $R_{H\_M}$ and a reference resistance $R_{H\_REF}$, for calculating an adjusted electrical pulse profile based on the calculated scaled values, and for outputting signals indicative of the adjusted electrical pulse profile; and a heater controller and driver, coupled to the processor and the resistive heater, for applying the adjusted electrical pulse profile to the resistive heater.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses circuits and methods that enable stacking of phase change material (PCM) switches and that accommodate variations in the resistance of the resistive heater(s) of such switches. Stacking is enabled by providing isolation switches for the resistive heater(s) in a PCM switch to reduce parasitic capacitance caused by the proximity of the resistive heater(s) to the PCM region of a PCM switch. Variations in the resistance of the resistive heater(s) of a PCM switch are mitigated or eliminated by sensing the actual resistance of the resistive heater(s) and then determining a suitable adjusted electrical pulse profile for the resistive heater(s) that generates a precise thermal pulse to the PCM region, thereby reliably achieving a desired switch state while extending the life of the resistive heater(s) and the phase-change material.

Stacking of PCM Switches

Figure 3:
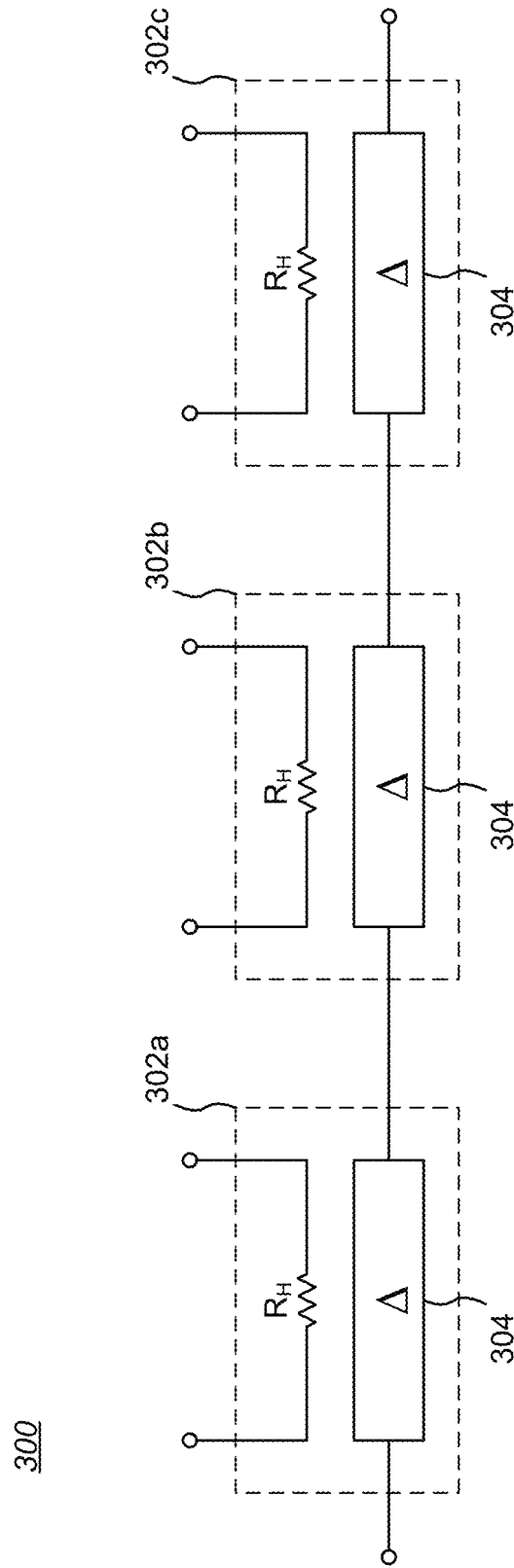
FIG. 3 is a block diagram showing a stack of three PCM switches connected in series.

FIG. 3 is a block diagram showing a stack 100 of three PCM switches 102a-102c connected in series. A desired characteristic of such a stack 100 for switching radio frequency (RF) signals is the ability to withstand high RF voltages when in the OFF state by essentially evenly dividing an applied voltage across the three PCM switches 102a-102c. However, as suggested by the proximity of the resistive heater $R_H$ to the PCM region 304 in each PCM switch 102a-102c, there is capacitive coupling between the PCM region 304 and the resistive heater $R_H$ which creates uneven voltage division between the PCM switches 102a-102c in the stack 100.

Figure 1A:
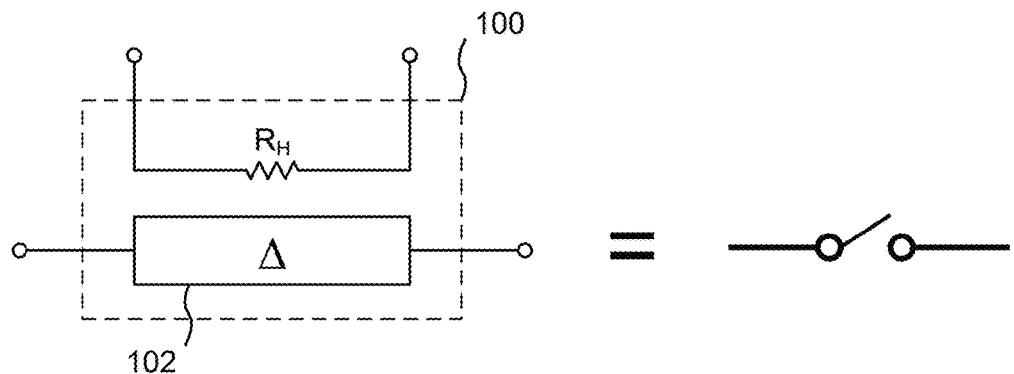
FIG. 1A is a diagram of a prior art electrical symbol for a PCM switch, and an equivalent single-pole, single-throw switch symbol.
Figure 1B:
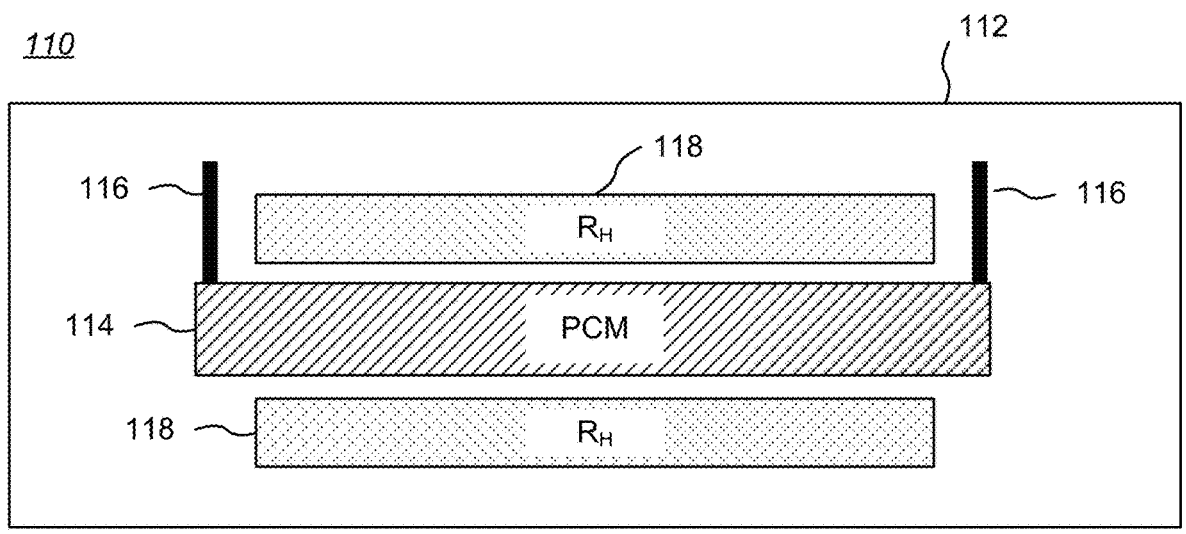
FIG. 1B is a stylized cross-sectional view of a portion of an IC showing the physical structure of a PCM switch.

To better understand the consequences of capacitive coupling between the PCM region 304 and the resistive heater $R_H$, it is useful to consider the materials and electrical characteristics of a PCM switch in detail. The PCM region 304 may be made of a chalcogenide alloy; examples include germanium-antimony-tellurium (GST), germanium-tellurium, and germanium-antimony. The resistive heater $R_H$ (referred to in the singular here, but may be implemented as multiple heating elements, as shown in FIG. 1B) may be made of a metal (e.g., copper, aluminum, nickel-chromium, or tungsten) or of any other material compatible with IC fabrication and which heats when subjected to electrical power. The resistive heater $R_H$ in proximity to the PCM region 304 forms two plates of a capacitor. Such capacitive coupling is compounded when multiple resistive heaters $R_H$ are used.

Figure 4A:
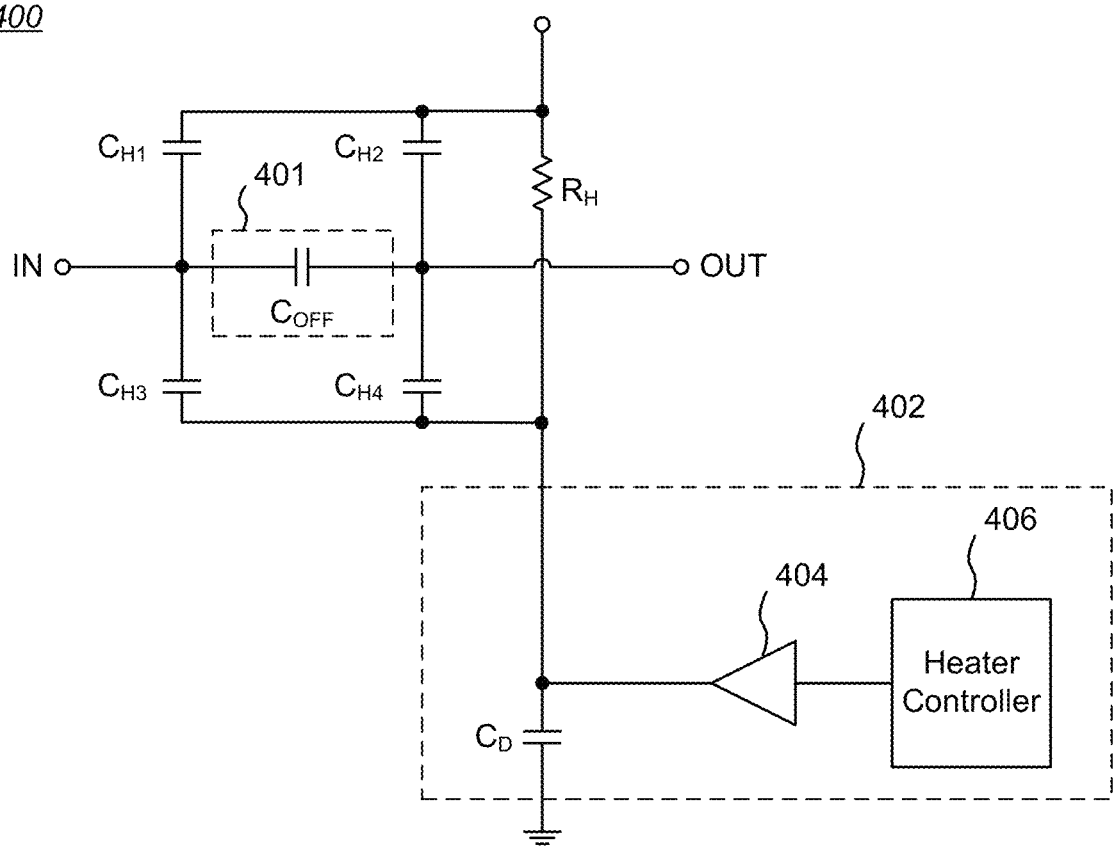
FIG. 4A is a schematic diagram of a modeled equivalent circuit for a PCM switch in an OFF state.

FIG. 4A is a schematic diagram of a modeled equivalent circuit for a PCM switch 400 in an OFF state. The OFF-state (amorphous) PCM region 401 of the PCM switch 400 is modeled as a capacitance $C_{OFF}$ between IN and OUT terminals, while the parasitic coupled capacitance of the resistive heater $R_H$ is shown as capacitances $C_{H1}$-$C_{H4}$ coupled to $C_{OFF}$ as shown. Capacitances $C_{H1}$-$C_{H4}$ are shown as AC grounded but may be differentially driven, and $C_{OFF}$ is smaller than the capacitances $C_{H1}$-$C_{H4}$. For the example model, $C_{OFF}$ may be about 1.8 fF, capacitances $C_{H1}$-$C_{H4}$ may each be about 4 fF, and $R_H$ may be from about 5 to about 20 ohms. In an ON state, the capacitance $C_{OFF}$ of the PCM region 401 would be replaced in the equivalent circuit by a resistance $R_{ON}$, which may be about 1-3 ohms.

In the illustrated example, driver and control circuitry 402 is shown coupled to the resistive heater $R_H$. In this example, the driver and control circuitry 402 includes a driver circuit 404 having an associated output capacitance $C_D$. A control circuit 406 coupled to the driver circuit 404 provides precise amounts of electrical power through the resistive heater $R_H$ for precise periods of time to generate thermal profiles that control phase state changes of the PCM region 401. To control the resistive heater $R_H$, one of the heater terminals may be grounded and the other heater terminal used to apply a programming (state change) pulse through the driver circuit 404.

Figure 4B:
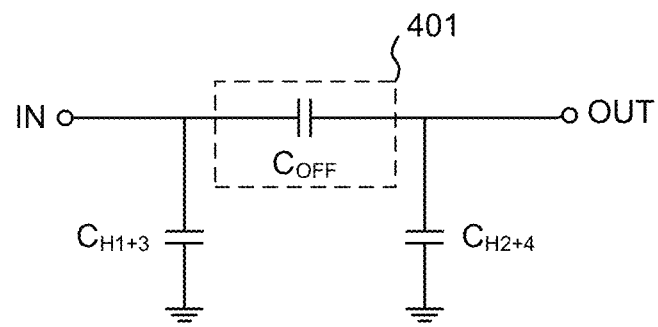
FIG. 4B is a schematic diagram of a simplified modeled OFF-state equivalent circuit for the PCM switch of FIG. 4A.

FIG. 4B is a schematic diagram of a simplified modeled OFF-state equivalent circuit for the PCM switch 400 of FIG. 4A (note that the driver and control circuitry 402 of FIG. 4A is not modeled in FIG. 4B). The OFF-state (amorphous) PCM region 401 of the PCM switch 400 is again modeled as a capacitance $C_{OFF}$ between IN and OUT terminals. The capacitances $C_{H1}$-$C_{H4}$ of FIG. 4A are shown as AC grounded and may be modeled as summed shunt capacitances $C_{H1+3}$ and $C_{H2+4}$ coupled respectively to the IN and OUT terminals of the PCM switch 400. For the example model, $C_{OFF}$ again may be about 1.8 fF and capacitances $C_{H1+3}$ and $C_{H2+4}$ may each be about 8 fF.

Figure 5A:
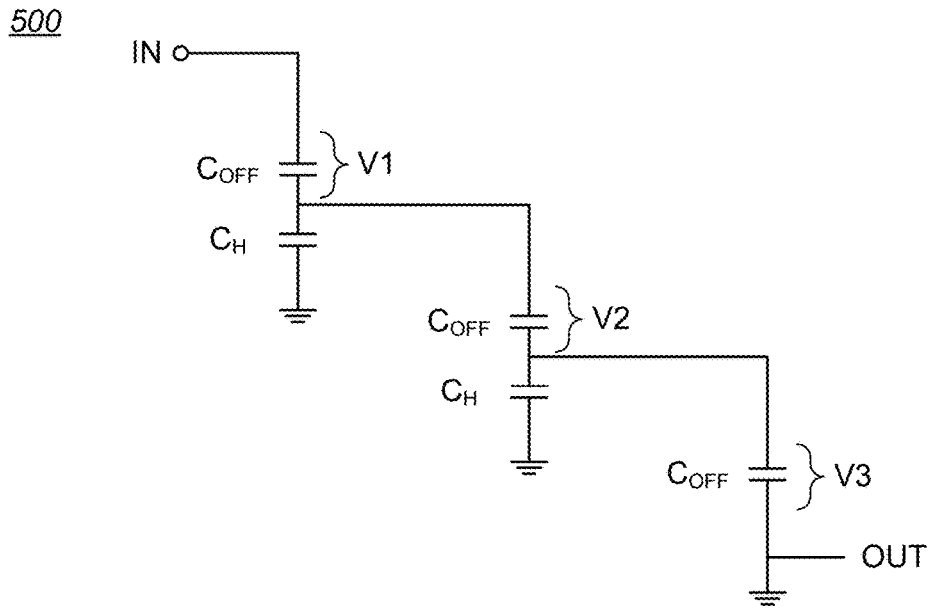
FIG. 5A is a schematic diagram of a simplified modeled equivalent circuit for a stack of three PCM switches in an OFF state and configured as a shunt switch.

FIG. 5A is a schematic diagram of a simplified modeled equivalent circuit for a stack 500 of three PCM switches in an OFF state and configured as a shunt switch. FIG. 5A thus represents the circuit of FIG. 3 in an OFF state. (Note that the circuit shown in FIG. 5A may also be used as a series or through switch by not grounding one terminal). Extending the model of FIG. 4B, the summed parasitic capacitances due to the resistive heaters $R_H$ are shown as $C_H$. For the example model, $C_{OFF}$ again may be about 1.8 fF and capacitances $C_H$ may each be about 16 fF.

If an RF signal is applied to the IN terminal, the applied voltage results in a voltage V1 across the $C_{OFF}$ capacitance of the first stack unit, which is much greater than the voltage V2 across the $C_{OFF}$ capacitance of the second stack unit and the voltage V3 across the $C_{OFF}$ capacitance of the third stack unit.

Figure 5B:
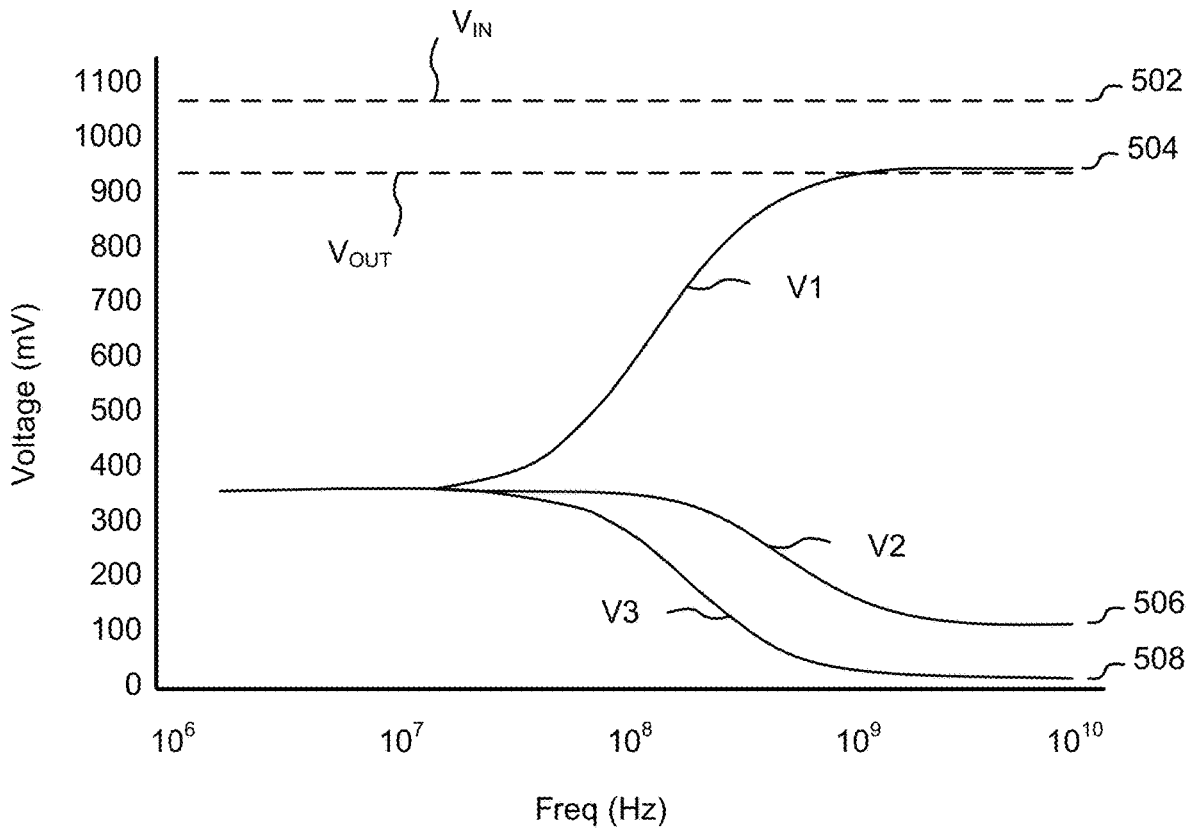
FIG. 5B is a graph of applied RF voltage across a simulated stack of three PCM switches in an OFF state as a function of frequency.

FIG. 5B is a graph of applied RF voltage across a simulated stack of three PCM switches in an OFF state as a function of frequency. In the illustrated example, at about 10 GHz, an applied voltage $V_{IN}$ of about 1080 mV (graph line 502) results in a voltage V1 of about 960 mV (graph line 504), a voltage V2 of about 106 mV (graph line 506), and a voltage V3 of about 20 mV (graph line 508). The high value of V1 may lead to device failure and thus render device stacking ineffective.

Figure 6:
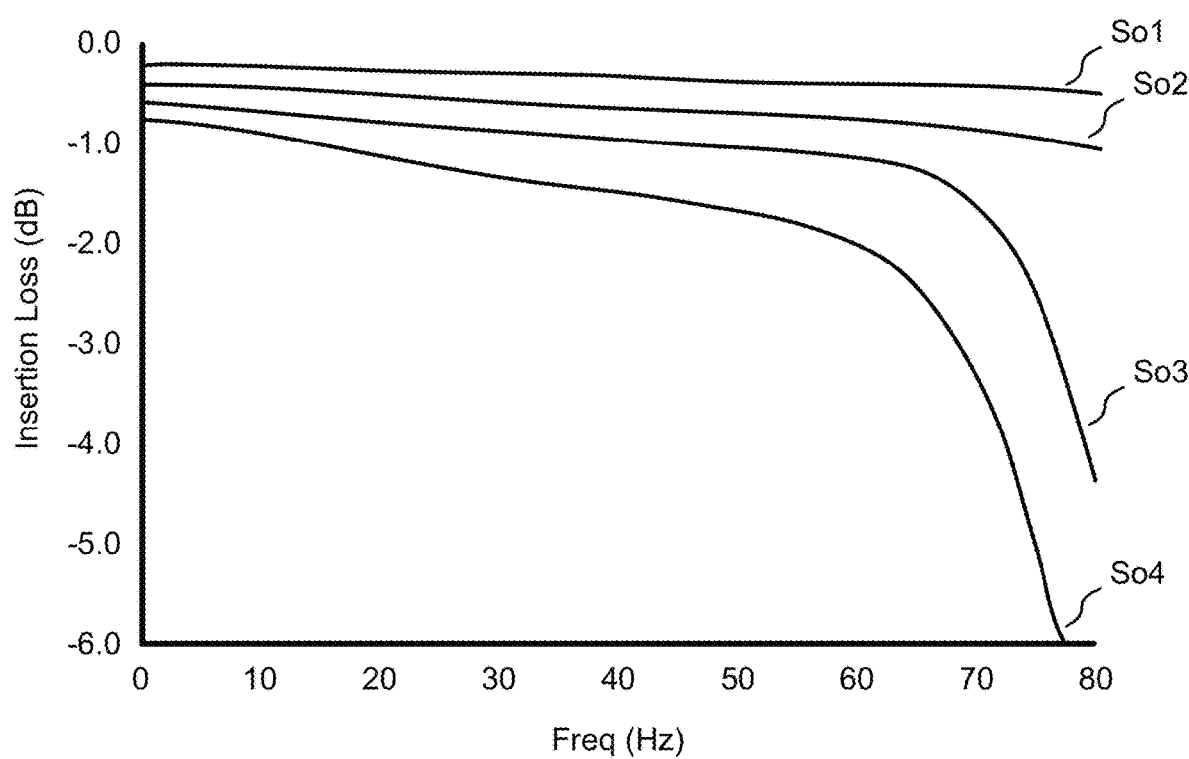
FIG. 6 is a graph of insertion loss as a function of frequency for PCM switches having capacitive compensation.

A conventional solution for such uneven voltage division would be to add capacitive compensation, such as by adding a capacitor (not shown) in parallel with the IN and OUT terminals of the PCM switch 400 of FIG. 4A. However, capacitive compensation of RF switches alone does not work as well for PCM technology. For example, FIG. 6 is a graph 600 of insertion loss as a function of frequency for PCM switches having capacitive compensation. The graph 600 shows the loss vs. frequency characteristics of four different stack heights, from a stack of 1 (graph line So1) to a stack of 4 (graph line So4).

As the graph 600 indicates, insertion loss increases dramatically with stack height as frequency increases. This is due to an increase in the overall $R_{ON}*C_{OFF}$ of the stack of PCM switches, eliminating PCM's $R_{ON}*C_{OFF}$ advantage relative to RF SOI switches. As is known, $R_{ON}*C_{OFF}$ is a figure of merit (FOM) used to rate the overall performance of an RF switch. A high performance single RF SOI switch may have an $R_{ON}*C_{OFF}$ FOM of about 80 fs to 100 fs, while a high performance single PCM switch may have an $R_{ON}*C_{OFF}$ FOM of less than about 10 fs—a significant improvement over an RF SOI switch. However, stacking PCM switches and adding capacitive compensation to improve uneven voltage division increases the overall $R_{ON}*C_{OFF}$ FOM, essentially eroding the advantage of using PCM switches in the first place.

Figure 7A:
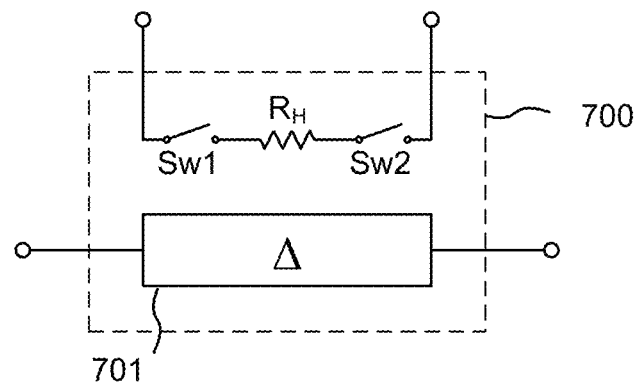
FIG. 7A is a diagram of a stylized PCM switch showing the resistive heater $R_H$ bracketed by isolation switches Sw1 and Sw2.

A solution that enables stacking of PCM switches while reducing the impact on the overall $R_{ON}*C_{OFF}$ FOM and increasing frequency response (bandwidth) is to provide auxiliary isolation switches for the resistive heater(s) in a PCM switch. FIG. 7A is a diagram of a stylized PCM switch 700 showing the resistive heater $R_H$ bracketed by isolation switches Sw1 and Sw2. When the resistive heater $R_H$ is not active (i.e., when not heating the PCM region 701), then the isolation switches Sw1, Sw2 are set to be OPEN, allowing the resistive heater $R_H$ to float. When the resistive heater $R_H$ is active (i.e., when heating the PCM region 701 to change ON/OFF state), then the isolation switches Sw1, Sw2 are CLOSED.

Figure 7B:
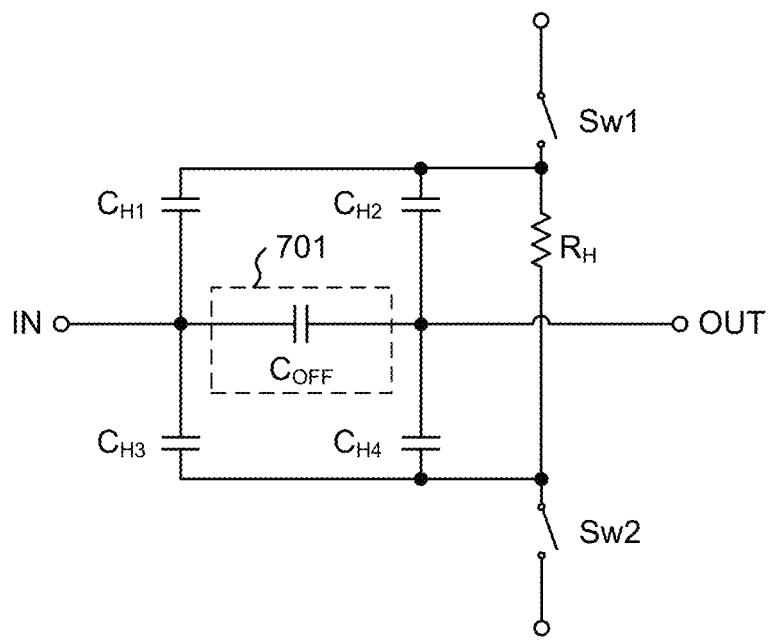
FIG. 7B is a schematic diagram of a modeled equivalent circuit for the PCM switch of FIG. 7A in an OFF state.

FIG. 7B is a schematic diagram of a modeled equivalent circuit for the PCM switch 700 of FIG. 7A in an OFF state. The OFF-state (amorphous) PCM region 701 of the PCM switch 700 is modeled as a capacitance $C_{OFF}$ between IN and OUT terminals, while the parasitic coupled capacitance of the resistive heater $R_H$ is shown as capacitances $C_{H1}$-$C_{H4}$ coupled to $C_{OFF}$ as shown. When the isolation switches Sw1, Sw2 are set to be OPEN, capacitances $C_{H1}$-$C_{H4}$ are floating (rather than grounded). For the example model, $C_{OFF}$ may be about 1.8 fF, capacitances $C_{H1}$-$C_{H4}$ may each be about 4 fF, and $R_H$ may be from about 5 to about 20 ohms. In an ON state, the $R_{ON}$ of the PCM region 701 may be about 1-3 ohms. The associated driver circuit and control circuit are omitted to reduce clutter. A driver circuit may be connected to the pole/throw of either switch Sw1 or Sw2. Alternatively, differential driver circuits and a corresponding control circuit may be used.

Figure 7C:
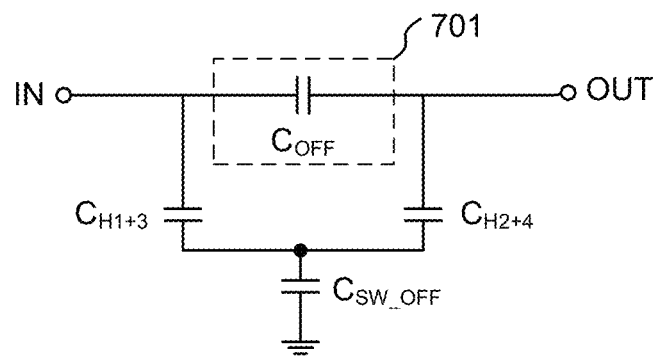
FIG. 7C is a schematic diagram of a simplified modeled OFF-state equivalent circuit for the PCM switch of FIG. 7A, taking into account the OFF-state capacitance of the isolation switches Sw1, Sw2.

FIG. 7C is a schematic diagram of a simplified modeled OFF-state equivalent circuit for the PCM switch 700 of FIG. 7A, taking into account the OFF-state capacitance of the isolation switches Sw1, Sw2. The OFF-state (amorphous) PCM region 701 of the PCM switch 700 is again modeled as a capacitance $C_{OFF}$ between IN and OUT terminals. The capacitances $C_{H1}$-$C_{H4}$ of FIG. 7B may be modeled as summed capacitances $C_{H1+3}$ and $C_{H2+4}$ having respective first terminals coupled respectively to the IN and OUT terminals of the PCM switch 700. A second terminal of the summed capacitances $C_{H1+3}$ and $C_{H2+4}$ is coupled to a shunt capacitance $C_{SW\_OFF}$, which represents the summed $C_{OFF}$ capacitances of both isolation switches Sw1, Sw2. For the example model, $C_{OFF}$ may be about 1.8 fF, capacitances $C_{H1+3}$ and $C_{H2+4}$ may each be about 8 fF, and capacitance $C_{SW\_OFF}$ may be about 11 fF.

The isolation switches Sw1, Sw2 may be implemented in any suitable technology, including field effect transistors, bipolar transistors, MEMS (micro-electromechanical system) switches, or even PCM switches, but preferably should have a low $C_{SW\_OFF}$ and a low $R_{ON}$, with the $C_{SW\_OFF}$ being relatively lower than $C_H$ for larger benefits. If PCM switches are used, floating the internal resistive heater $R_H$ of the isolation switches Sw1, Sw2 is generally not necessary, since the isolation switches Sw1, Sw2 normally will not be subjected to high voltages and thus generally do not need to be stacked.

Figure 7D:
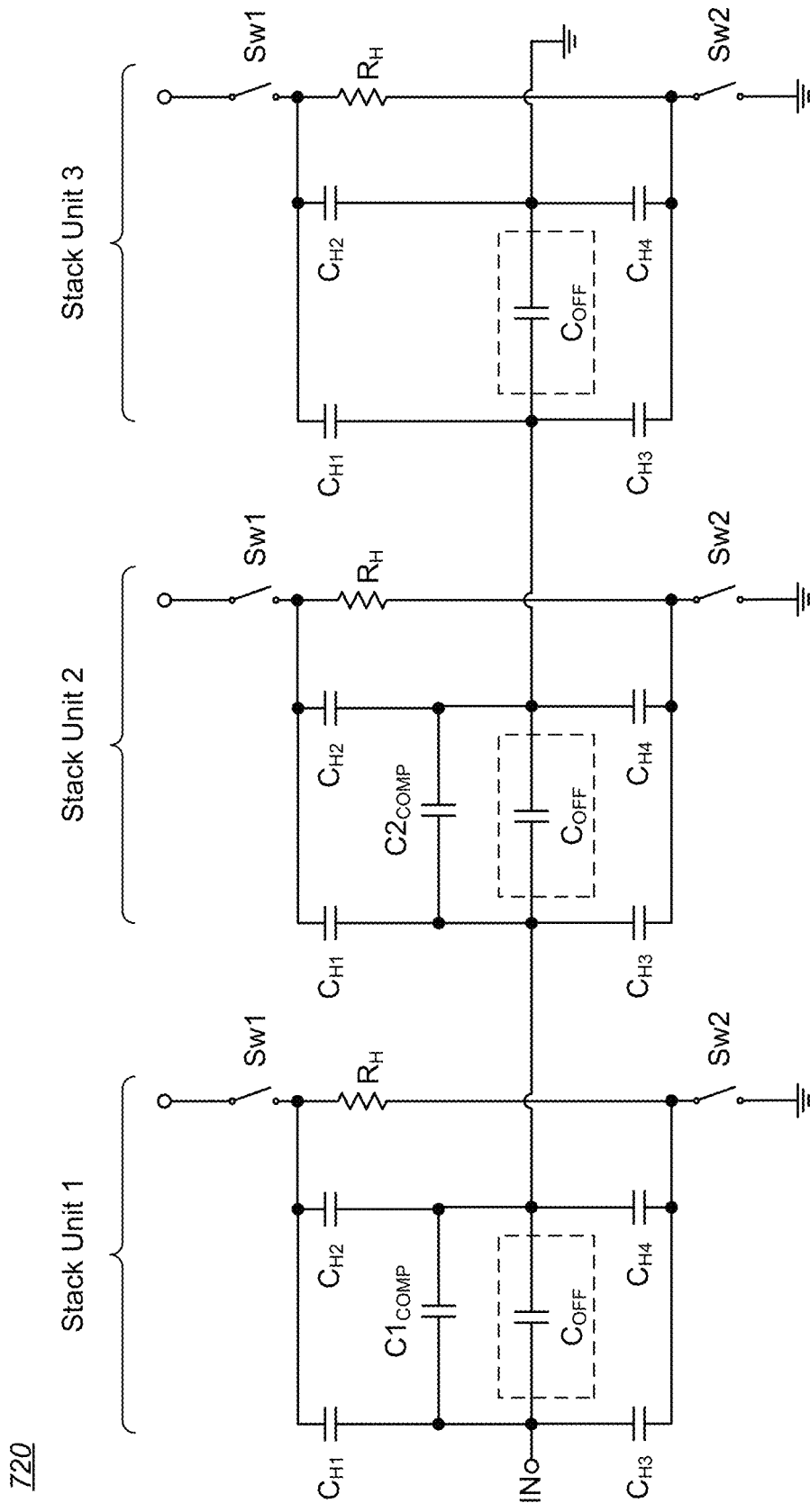
FIG. 7D is a schematic diagram of a modeled equivalent circuit of a stack of three PCM switch units series-coupled in an RF shunt switch configuration.

Adding the isolation switches Sw1, Sw2 (and thus placing equivalent capacitance $C_{SW\_OFF}$ in series with capacitances $C_{H1+3}$ and $C_{H2+4}$) substantially improves the bandwidth of a stack of PCM switches and enables the use of capacitive compensation to improve uneven voltage division across the stack units (individual PCM switches). For example, FIG. 7D is a schematic diagram of a modeled equivalent circuit of a stack 720 of three PCM switch units series-coupled in an RF shunt switch configuration. Each stack unit 1-3 is similar to the circuit shown in FIG. 7B, with the "top" switch Sw1 for each stack unit usually being AC grounded to avoid LC resonances and to balance the circuit (otherwise RF current can flow through the heater $R_H$). However, in this example, stack units 1 and 2 include respective compensation capacitors $C1_{COMP}$, $C2_{COMP}$ to improve voltage division across the stack 720. The inclusion of the isolation switches Sw1, Sw2 allows use of smaller compensation capacitors. For example, TABLE 1 below shows values for compensation capacitors that may be used in the circuit of FIG. 7D, and the resulting total stack $C_{OFF}$ value with or without isolation switches Sw1, Sw2. As the table values show, inclusion of the isolation switches Sw1, Sw2 allows use of compensation capacitors having values that are almost half the values needed in a stack configuration that omits the isolation switches Sw1, Sw2, and the resulting stack equivalent $C_{OFF}$ is about 41% less.

TABLE 1

| Configuration | $C1_{COMP}$ | $C2_{COMP}$ | Stack Equivalent $C_{OFF}$ total |
|---|---|---|---|
| With isolation switches | 26.5 fF | 8.7 fF | 14.4 fF |
| Without isolation switches | 48 fF | 16 fF | 24.6 fF |

Note that the circuit shown in FIG. 7D may also be used as a series or through switch by not grounding one terminal. Also note that the stack units may share a single Sw1 and Sw2.

Figure 7E:
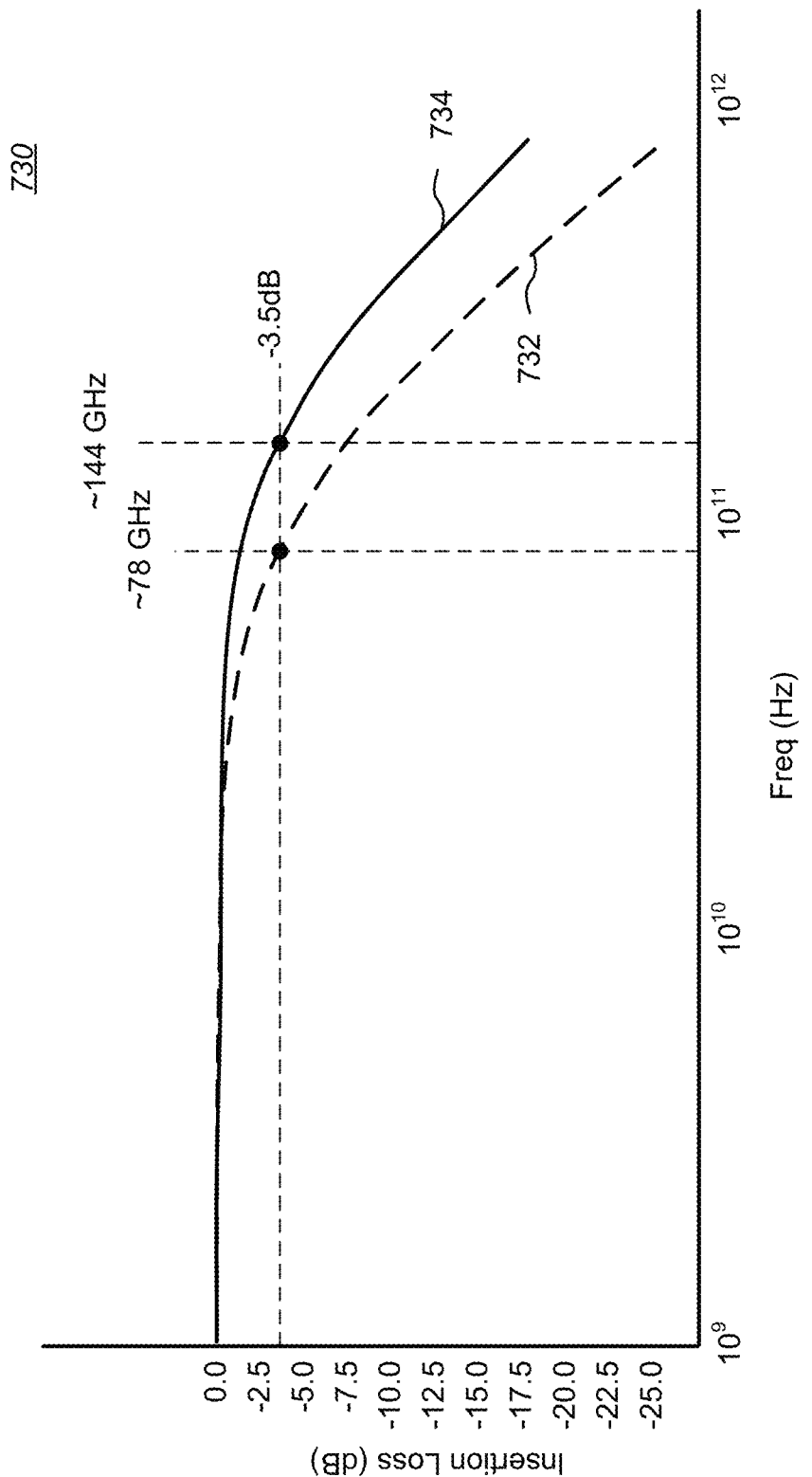
FIG. 7E is a graph of insertion loss as a function of frequency for a stack of three PCM switches that lack isolation switches and capacitive compensation and for a stack of three PCM switches that include isolation switches and capacitive compensation.

FIG. 7E is a graph 730 of insertion loss as a function of frequency for a stack of three PCM switches that lack isolation switches and capacitive compensation (graph line 732) and for a stack of three PCM switches that include isolation switches and capacitive compensation (graph line 734). As graph 730 indicates, a stack configuration that includes isolation switches and capacitive compensation for essentially even voltage division has a much higher bandwidth. For example, graph line 732 drops to about −3.5 dB at about 78 GHz, while graph line 734 drops to about −3.5 dB at about 144 GHz, resulting in about 2 times improvement in bandwidth.

Another aspect of the invention includes methods for reducing parasitic capacitance caused by the proximity of a resistive heater to a phase change material (PCM) region of a PCM switch by electrically isolating the resistive heater while an electrical pulse profile is not to be applied to the resistive heater.

Figure 8:
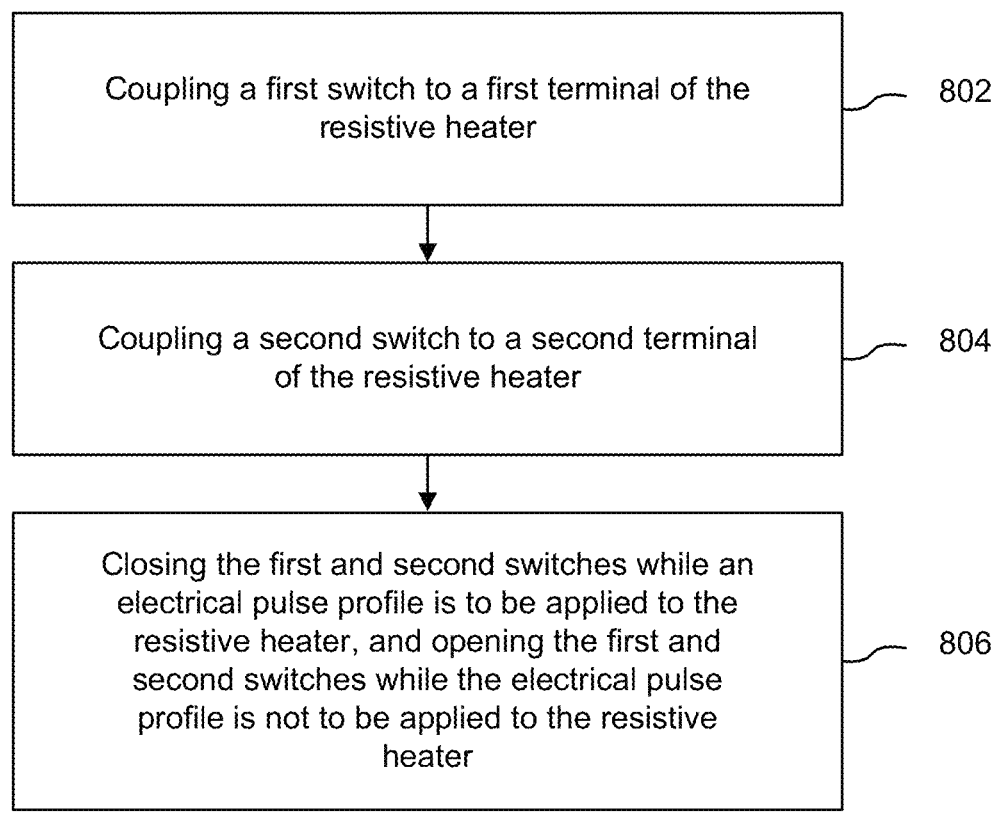
FIG. 8 is a process flow chart showing a first method for reducing parasitic capacitance caused by the proximity of a resistive heater to a phase change material (PCM) region of a PCM switch.

For example, FIG. 8 is a process flow chart 800 showing a first method for reducing parasitic capacitance caused by the proximity of a resistive heater to a phase change material (PCM) region of a PCM switch. The method includes: coupling a first switch to a first terminal of the resistive heater [Block 802]; coupling a second switch to a second terminal of the resistive heater [Block 804]; and closing the first and second switches while an electrical pulse profile is to be applied to the resistive heater, and opening the first and second switches while the electrical pulse profile is not to be applied to the resistive heater [Block 806].

Inductor-based Isolation Embodiment

Figure 9A:
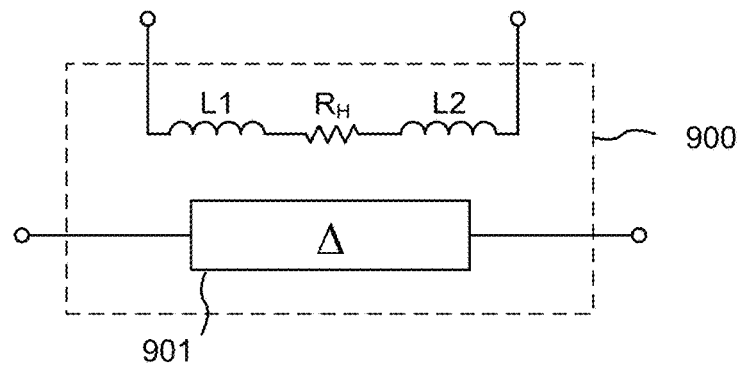
FIG. 9A is a diagram of a stylized PCM switch showing a resistive heater $R_H$ adjacent a PCM region, where the resistive heater $R_H$ is bracketed by inductors L1 and L2.
Figure 9B:
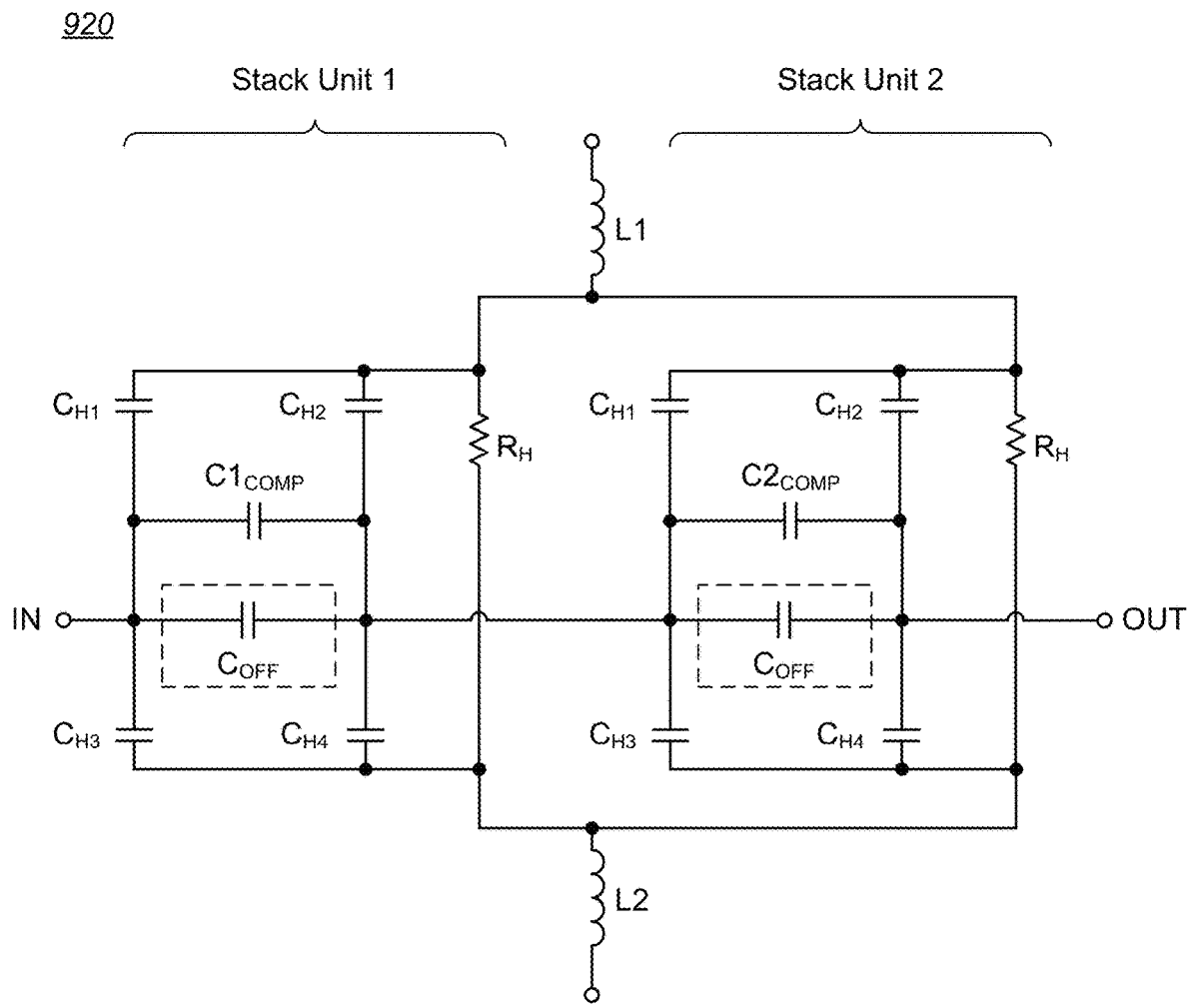
FIG. 9B is a schematic diagram of a modeled equivalent circuit of a stack of two PCM switch units series-coupled in an RF through switch configuration.

In alternative embodiments, rather than providing auxiliary isolation switches, compensation for the parasitic capacitance of the resistive heater(s) $R_H$ may be accomplished by use of designed-in inductances. For example, FIG. 9A is a diagram of a stylized PCM switch 900 showing a resistive heater $R_H$ adjacent a PCM region 901, where the resistive heater $R_H$ is bracketed by inductors L1 and L2. FIG. 9B is a schematic diagram of a modeled equivalent circuit of a stack 920 of two PCM switch units series-coupled in an RF through switch configuration. In the illustrated example, the inductors L1 and L2 are shared by both stack units 1, 2. In other embodiments, each stack unit 1, 2, may have its own set of corresponding inductors L1 and L2.

The inductors L1 and L2 in conjunction with the parasitic capacitances $C_{H1}$-$C_{H4}$ from the proximity of the resistive heater $R_H$ and the PCM region 901 essentially form an LC low pass filter. Some care should be taken to make sure that L*di/dt (the voltage across the inductors) does not exceed component specifications, and that the LC resonances do not interfere with RF frequencies of interest. Compensation capacitors may be added to the circuit, similar to the configuration shown in FIG. 7D.

Adapting to Variations in Resistive Heater Values

As noted above, variations in the resistance of the resistive heater(s) of a PCM switch may be mitigated or eliminated (countered) by sensing the actual resistance of the resistive heater(s) and then determining a suitable adjusted electrical pulse profile for the resistive heater(s) that generates a precise thermal pulse to the PCM region, thereby reliably achieving a desired switch state while extending the life of the resistive heater(s) and the phase-change material.

The adjusted electrical pulse profile is essentially a scaled profile that is function of the designed resistance $R_{H\_REF}$ of the resistive heater $R_H$, divided by the measured resistance $R_{H\_M}$ of the resistive heater $R_H$.

Figure 10:
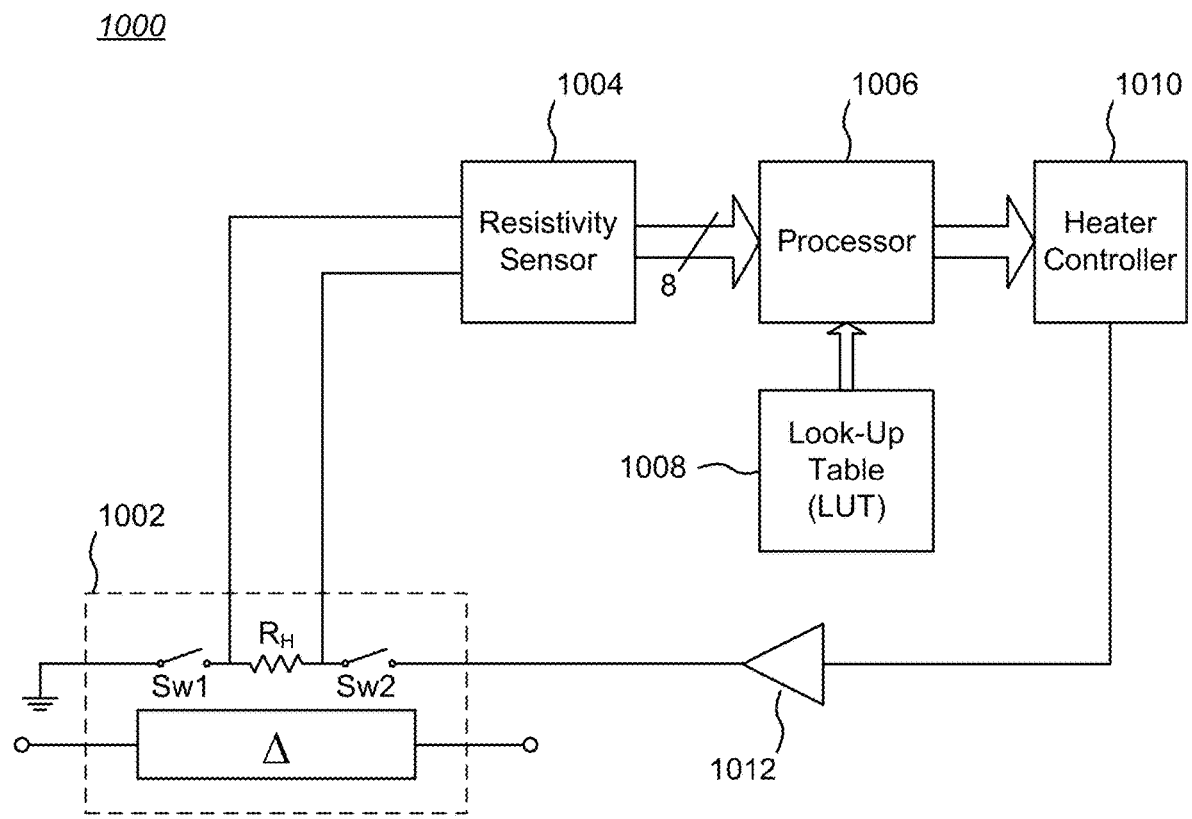
FIG. 10 is a block diagram of one circuit for measuring the resistance of the resistive heater(s) of a PCM switch.

For example, FIG. 10 is a block diagram of one circuit for measuring the resistance of the resistive heater(s) of a PCM switch 1002. The PCM switch 1002 is shown as including isolation switches Sw1, Sw2, as described above with respect to FIG. 7A, but may be a conventional PCM switch lacking resistive heater $R_H$ isolation switches (e.g., as shown in FIG. 4A). Coupled to the resistive heater $R_H$ of the PCM switch 1002 is a resistivity sensor 1004 designed to determine the resistance of the resistive heater $R_H$ using Ohm's law, R=V/I. Accordingly, the resistivity sensor 1004 may be configured to measure a voltage across the resistive heater $R_H$ when a known current is applied to the resistive heater $R_H$, or a current through the resistive heater $R_H$ when a known voltage is applied to the resistive heater $R_H$.

Preferably the resistivity sensor 1004 outputs a digital representation of the measured value (voltage or current). In some embodiments, the resistivity sensor 1004 may be a conventional voltage or current analog-to-digital (ADC) circuit that outputs a digital value (e.g., an 8-bit word) representing the measured value. The measured value may be applied to a processor 1006 which in some embodiments is capable of performing basic arithmetic functions. The processor 1006 may be coupled to a look-up table (LUT) 1008 that stores reference values used in computing an adjusted electrical pulse profile for the PCM switch 1002. In alternative embodiments, such reference values may be stored within the processor 1006.

In some embodiments, the processor 1006 computes the measured resistance $R_{H\_M}$ of the resistive heater $R_H$ based on the measured value from the resistivity sensor 1004, as well as an adjusted electrical pulse profile for the PCM switch 1002 based on the measured resistance $R_{H\_M}$. In some embodiments, the processor 1006 may use the received measured resistance $R_{H\_M}$ to look-up a pre-determined adjusted electrical pulse profile for the PCM switch 1002. Once an adjusted electrical pulse profile is determined, the processor 1006 applies one or more corresponding control signals to a heater controller 1010. The heater controller 1010 in turn outputs the adjusted electrical pulse profile (adjusted in amplitude and/or in pulse width/time) to a driver circuit 1012 that applies corresponding electrical energy to the resistive heater $R_H$ of the PCM switch 1002.

The heater controller 1010 may be configured to deliver a known current through or voltage to the resistive heater $R_H$ in order to enable the resistivity sensor 1004 to measure a corresponding voltage or current. In alternative embodiments, the resistivity sensor 1004 may be configured with its own voltage or current source configured to deliver a known current through or voltage to the resistive heater $R_H$. In some embodiments, the resistivity sensor 1004 may be configured to compute the measured resistance $R_{H\_M}$ and output a digital representation of the value to the processor 1006. Thus, in some embodiments, the resistivity sensor 1004 may be configured to function as a digital ohmmeter. As should be clear, other circuits or methods may be used to measure the resistance $R_{H\_M}$ of the resistive heater $R_H$.

In order to compute an adjusted electrical pulse profile, nominal or target reference values for a PCM switch 1002 should be determined. Deviation from one or more of these values are compensated for by embodiments of the invention. For example, it is useful to determine the nominal heater resistance $R_{H\_REF}$ and at least some of the parameter values set forth in TABLE 2 below. The nominal heater resistance $R_{H\_REF}$ may be determined, for example, by characterizing the resistance of the resistive heater $R_H$ during controlled testing of an IC device during the manufacturing process.

TABLE 2

| Parameter | OFF State | ON State |
| --- | --- | --- |
| Nominal voltage amplitude of pulse for inducing the state | $V_{OFF\_REF}$ | $V_{ON\_REF}$ |
| Nominal current amplitude of pulse for inducing the state | $I_{OFF\_REF}$ | $I_{ON\_REF}$ |
| Nominal time of pulse (duration) for inducing the state | $T_{OFF\_REF}$ | $T_{ON\_REF}$ |
| Nominal PCM switch pulse energy for inducing state | $E_{OFF\_REF}$ | $E_{ON\_REF}$ |

The first three parameters in TABLE 2 may be determined, for example, by characterizing the ON and OFF resistance of a particular PCM switch 1002 during IC testing while applying a pulse train having an increasing amplitude using ON and OFF programming pulses. The first three reference values in TABLE 2 may be established based on a statistical analysis of the measured resistance data. This characterization process may need to be done only once for a particular PCM switch 1002 and the results stored in a look-up table or the like. Subsequent pulse programming may be performed based on the stored reference parameter values and the measured heater resistance $R_{H\_M}$.

Figure 2A:
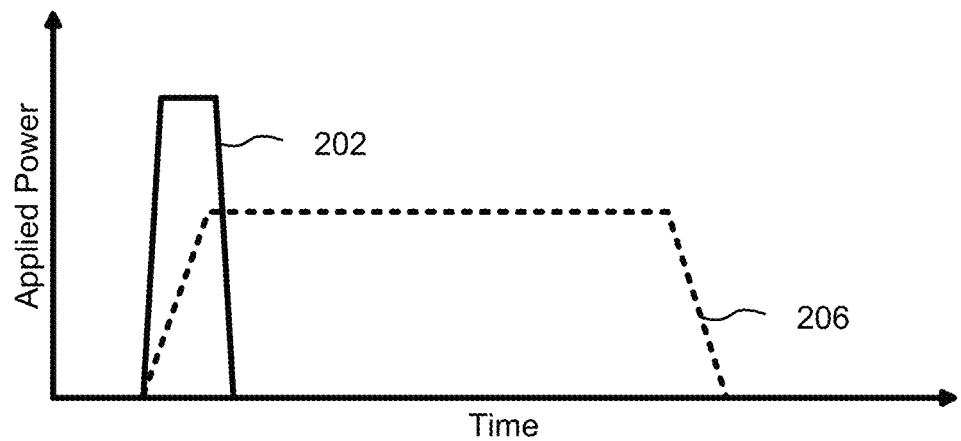
FIG. 2A is an example of two different power profiles for switching the resistivity states of the PCM region of FIG. 1B.
Figure 2B:
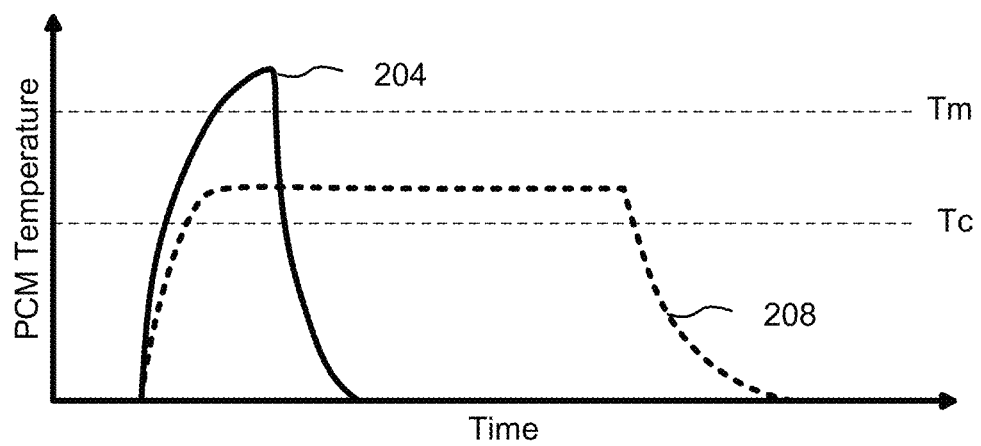
FIG. 2B is an example of the corresponding thermal profiles that cause switching of the resistivity states of the PCM region of FIG. 1B.

To change the state of a PCM switch 1002, a certain amount of electrical power dissipated in the resistive heater $R_H$ has to be maintained for a determined period of time, as shown in FIGS. 2A and 2B. This also corresponds to a specific energy delivered to the PCM region of the PCM switch 1002. The amount of nominal energy $E_{S\_REF}$ injected into the PCM region equals $(V_{S\_REF}^2/R_{H\_REF})*T_{S\_REF}$ in terms of voltage and time, or $I_{S\_REF}^2*R_{H\_REF}*T_{S\_REF}$ in terms of current and time, where the subscript "S" is for "state" (ON or OFF). Calculated values for the nominal energy $E_{S\_REF}$ (the fourth parameter in TABLE 2) may be stored in a look-up table or the like, or $E_{S\_REF}$ may be recalculated as needed from the other parameters in TABLE 2.

If the resistance of the resistive heater $R_H$ changes, then the pulse profile that needs to be applied to the resistive heater $R_H$ must be recalculated to equal the original nominal energy value $E_{S\_REF}$. In recalculating the pulse profile, the current or voltage values need to be adjusted if pulse time is kept constant at $T_{S\_REF}$, or the pulse time needs to be adjusted if current or voltage are kept constant at a reference value for current control or voltage control, respectively. In some embodiments, a hybrid approach may be taken by adjusting at least two of current, voltage, and/or time (e.g., if a computed adjustment in voltage or current exceeds the limits of a power supply, then pulse duration may be increased).

Once the reference parameter values in TABLE 2 are determined, then an adjusted electrical pulse profile may be determined by calculating new values for voltage, current, and/or time as a function of $R_{H\_M}$. TABLE 3 sets forth the new parameter values that may be selected for calculation.

TABLE 3

| Parameter | OFF State | ON State |
|---|---|---|
| Calculated new voltage value required with the measured $R_{H\_M}$ | $V_{OFF}$ | $V_{ON}$ |
| Calculated new current value required with the measured $R_{H\_M}$ | $I_{OFF}$ | $I_{ON}$ |
| Calculated new pulse time required with the measured $R_{H\_M}$ | $T_{OFF}$ | $T_{ON}$ |

The new values in TABLE 3 may be determined from the formulas in TABLE 4.

TABLE 4

Calculated Scaled Values based on $R_{H\_M}$
(the subscript "S" is for "state", ON or OFF)

$V_S$ = sqrt($R_{H\_M}/R_{H\_REF}$) * $V_{S\_REF}$
$I_S$ = sqrt($R_{H\_REF}/R_{H\_M}$) * $I_{S\_REF}$
$T_{S\_I}$ = ($R_{H\_REF}/R_{H\_M}$) * $T_{S\_REF}$ for current I control
$T_{S\_V}$ = ($R_{H\_M}/R_{H\_REF}$) * $T_{S\_REF}$ for voltage V control In essence, knowing that the nominal energy $E_{S\_REF}$ is essentially a constant, as $R_{H\_M}$ varies, one or more of the calculated scaled values for voltage, current, and time may be used as a parameter value for a new electrical pulse profile that delivers the same amount of energy. For example, for a constant pulse profile duration, a scaled voltage $V_S$ or a scaled current $I_S$ may be applied to deliver the amount of energy $E_{S\_REF}$ required for an ON or OFF state change. As another example, for a constant pulse profile amplitude, a scaled duration $T_{S\_I}$ or $T_{S\_V}$ may be applied to deliver the amount of energy $E_{S\_REF}$ required for an ON or OFF state change.

Figure 11A:
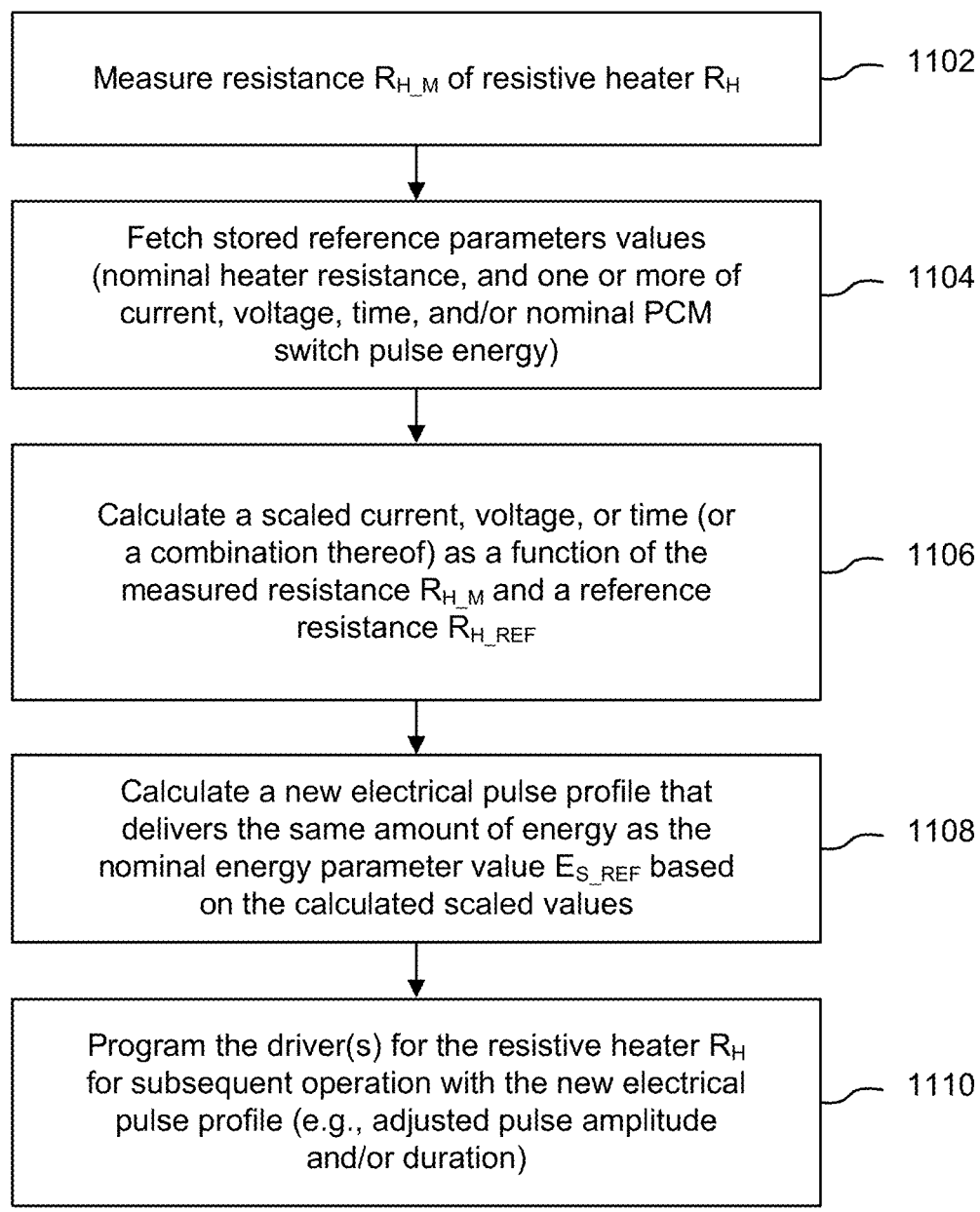
FIG. 11A is a process flowchart showing a generalized method for generating an adjusted electrical pulse profile to mitigate or eliminate variations in the resistance of the resistive heater(s) of a PCM switch.

FIG. 11A is a process flowchart 1100 showing a generalized method for generating an adjusted electrical pulse profile to mitigate or eliminate variations in the resistance of the resistive heater(s) of a PCM switch. The resistance $R_{H\_M}$ of the resistive heater $R_H$ is measured [Block 1102], and one or more selected stored reference parameter values are fetched [Block 1104]. Which reference parameter values to fetch will depend on which formulas or look-up methods described above are selected for implementation in the processor 1006. The fetched parameter values may include nominal heater resistance, and one or more of current, voltage, time, and/or nominal PCM switch pulse energy. As should be clear, the order of implementing blocks 1102 and 1104 may be reversed.

Next, calculate scaled values of current, voltage, or time (or a combination thereof) as a function of the measured resistance $R_{H\_M}$ and a reference resistance $R_{H\_REF}$ [Block 1106].

Next, calculate a new electrical pulse profile that delivers the same amount of energy as the nominal energy value $E_{S\_REF}$ (where the subscript "S" is for "state", ON or OFF) based on the calculated scaled values [Block 1108]. Thereafter, program the driver(s) for the resistive heater $R_H$ for subsequent operation with the new electrical pulse profile (e.g., adjusted pulse amplitude and/or duration) [Block 1110].

Figure 11B:
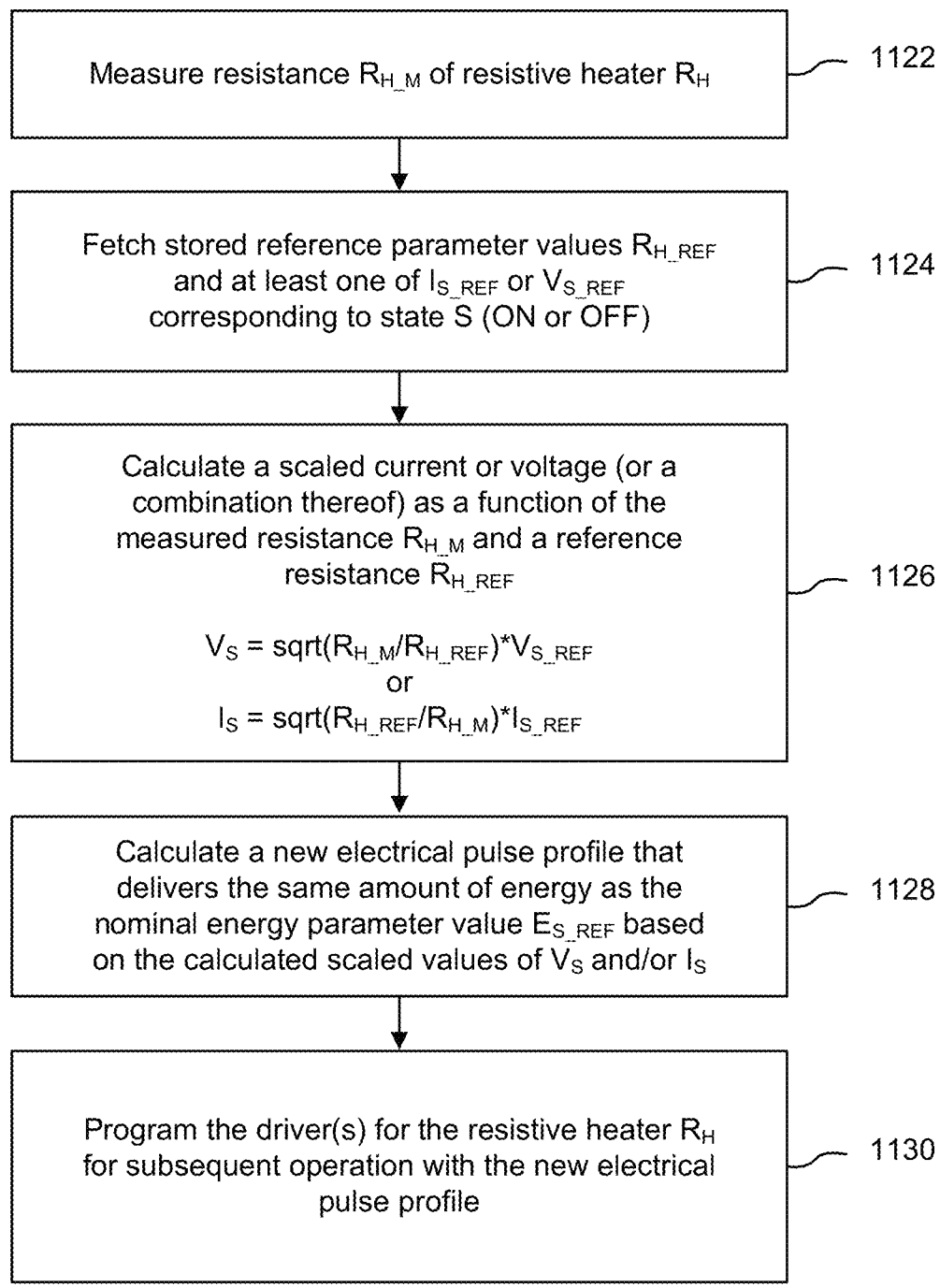
FIG. 11B is a process flowchart showing a more detailed method for generating an adjusted electrical pulse profile to mitigate or eliminate variations in the resistance of the resistive heater(s) of a PCM switch, with the assumption of a constant pulse duration.

FIG. 11B is a process flowchart 1120 showing a more detailed method for generating an adjusted electrical pulse profile to mitigate or eliminate variations in the resistance of the resistive heater(s) of a PCM switch, with the assumption of a constant pulse duration. The resistance $R_{H\_M}$ of the resistive heater $R_H$ is measured [Block 1122], and stored reference parameter values for $R_{H\_REF}$ and at least one of $I_{S\_REF}$ or $V_{S\_REF}$ corresponding to state S (ON or OFF) are fetched [Block 1124]. The order of implementing blocks 1122 and 1124 may be reversed.

Next, calculate a scaled current or voltage (or a combination thereof) as a function of the measured resistance $R_{H\_M}$ and the reference resistance $R_{H\_REF}$, using one or both of the following formulas from TABLE 4 [Block 1126]:

$$V_S = \text{sqrt}(R_{H\_M}/R_{H\_REF})*V_{S\_REF} \text{ and/or } I_S = \text{sqrt}(R_{H\_REF}/R_{H\_M})*I_{S\_REF}$$

Next, calculate a new electrical pulse profile that delivers the same amount of energy as the nominal energy value $E_{S\_REF}$ based on the calculated scaled values of $V_S$ and/or $I_S$ [Block 1128]. Thereafter, program the driver(s) for the resistive heater $R_H$ for subsequent operation with the new electrical pulse profile [Block 1130].

Figure 11C:
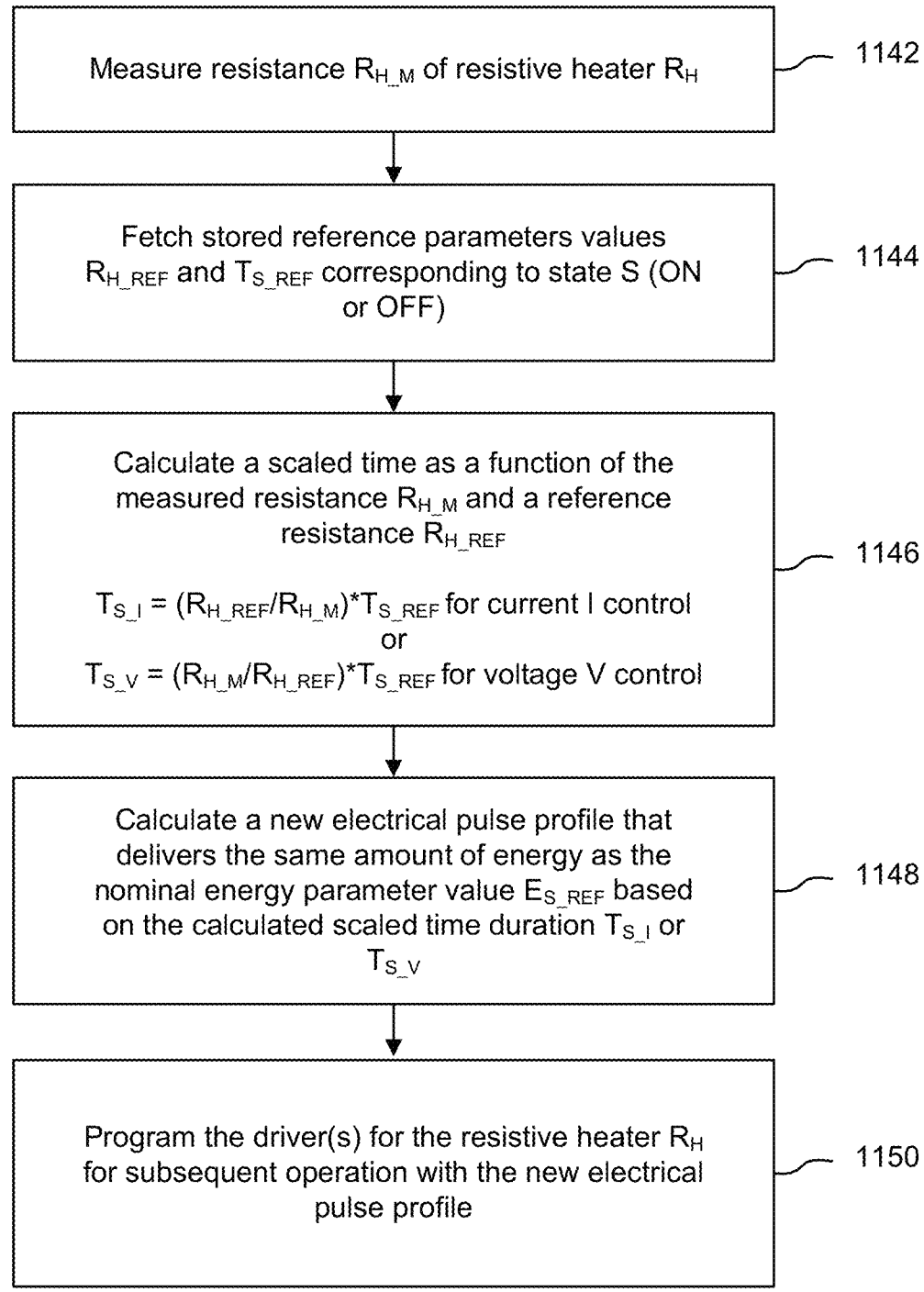
FIG. 11C is a process flowchart showing a more detailed method for generating an adjusted electrical pulse profile to mitigate or eliminate variations in the resistance of the resistive heater(s) of a PCM switch, with the assumption of a constant pulse amplitude.

FIG. 11C is a process flowchart 1140 showing a more detailed method for generating an adjusted electrical pulse profile to mitigate or eliminate variations in the resistance of the resistive heater(s) of a PCM switch, with the assumption of a constant pulse amplitude. The resistance $R_{H\_M}$ of the resistive heater $R_H$ is measured [Block 1142], and stored reference parameter values for $R_{H\_REF}$ and $T_{S\_REF}$ corresponding to state S (ON or OFF) are fetched [Block 1144]. The order of implementing blocks 1142 and 1144 may be reversed.

Next, calculate a scaled time as a function of the measured resistance $R_{H\_M}$ and the reference resistance $R_{H\_REF}$, using one or both of the following formulas from TABLE 4 [Block 1146]:

$$T_{S\_I} = (R_{H\_REF}/R_{H\_M})*T_{S\_REF} \text{ for current } I \text{ control}$$

$$T_{S\_V} = (R_{H\_M}/R_{H\_REF})*T_{S\_REF} \text{ for voltage } V \text{ control}$$

Next, calculate a new electrical pulse profile that delivers the same amount of energy as the nominal energy value $E_{S\_REF}$ based on the calculated scaled time duration $T_{S\_I}$ or $T_{S\_V}$ [Block 1148]. Thereafter, program the driver(s) for the resistive heater $R_H$ for subsequent operation with the new electrical pulse profile [Block 1150].

A number of different strategies may be used to implement the processes shown in FIGS. 11A-11C. For example, the actual resistance $R_{H\_M}$ of the resistive heater $R_H$ of one or more PCM switches may be measured during IC wafer testing and corresponding adjusted electrical pulse profiles may be programmed into each IC. As a variant, rather than measure an actual PCM switch, a replica device (e.g., comprising an unused PCM region and associated resistive heater $R_H$, or just a resistive heater $R_H$ alone that is fabricated to have the same characteristics as a resistive heater of a PCM switch) may be measured during IC wafer testing and corresponding adjusted electrical pulse profiles may be programmed into each IC. Basically, the actual resistance $R_{H\_M}$ of the resistive heater $R_H$ is characterized at test time.

In another variation, the actual resistance $R_{H\_M}$ of the resistive heater $R_H$ of one or more PCM switches or replicas may be measured during IC startup (that is, after power is applied to the IC), and corresponding adjusted electrical pulse profiles may be programmed into each IC. This method is a form of built-in self-testing and would offset process variations in switch heater resistance and heater resistance change due to device aging.

In yet another variation, the actual resistance $R_{H\_M}$ of a resistive heater $R_H$ of one or more PCM switches may be measured at each switching event (i.e., changing states from ON to OFF or from OFF to ON). This method would counteract changes in resistance from self-heating and/or environmental temperatures, as well as heater resistance changes due to device aging.

Circuit Embodiments

Figure 12:
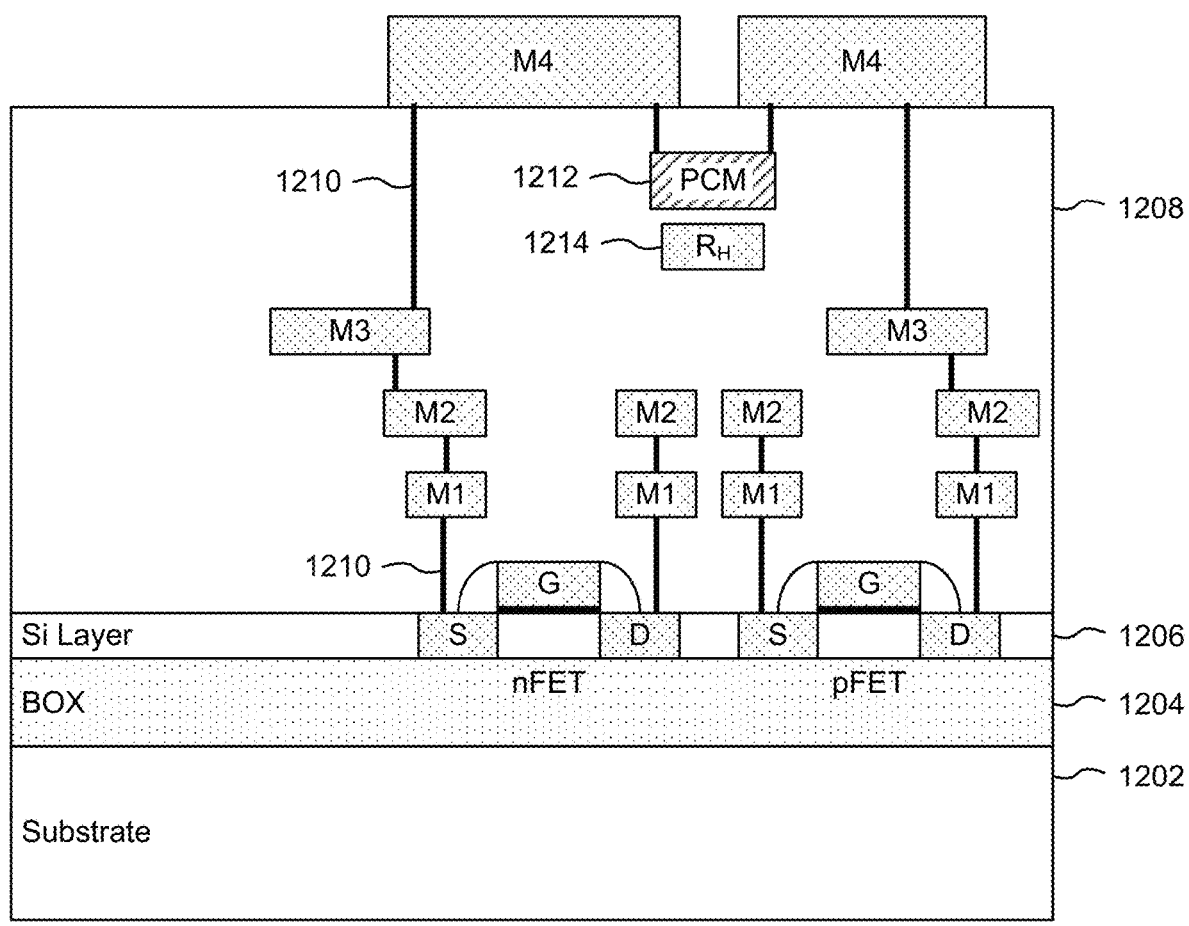
FIG. 12 is a cross-section diagram of an SOI IC that includes a PCM switch.

A number of characteristics of PCM switches make them highly useful as RF switches. For example, PCM switches are physically small (smaller than FET switches), have power consumption on par with FET switches at low switching rates (e.g., 10 Hz), are non-volatile (thus not requiring power to maintain a switch state), and may be readily integrated into ICs made with a number of fabrication processes. In particular, PCM switches may be integrated with silicon-on-insulator (SOI) FET devices. For example, FIG. 12 is a cross-section diagram of an SOI IC that includes a PCM switch. A substrate 1202 supports a buried oxide (BOX) insulator layer 1204, which in turn supports an active layer 1206. In the illustrated example, an nFET and a pFET are formed in and on the active layer 1206. Each FET includes a source S, drain D, and gate G. A superstructure 1208 is formed on the active layer 1206, and generally comprises inter-layer dielectric (ILD) with formed layers of metallization (M1, M2, M3, with M4 on top), and vertical conductors (vias) 1210. In the illustrated example, the superstructure 1208 also includes a PCM region 1212 with an adjacent resistive heater $R_H$ 1214.

Figure 13:
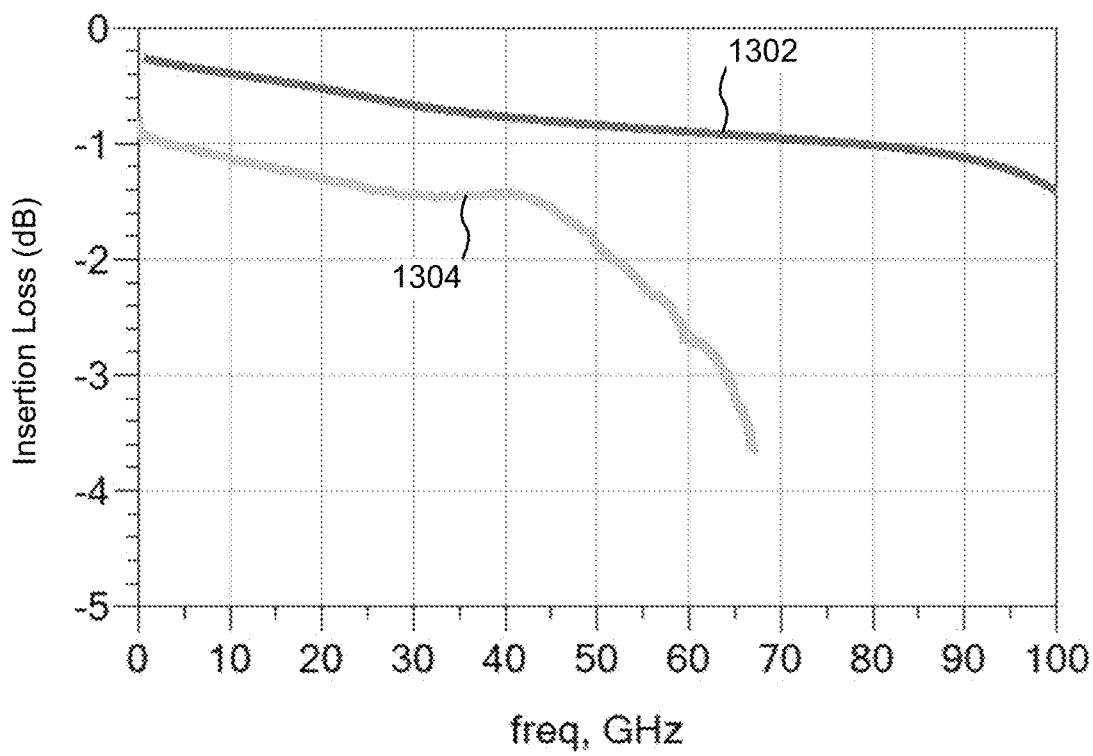
FIG. 13 is a graph showing insertion loss versus frequency for a modeled RF switch circuit based on a PCM switch and a measured RF switch circuit based on an SOI FET.

The very low $R_{ON}*C_{OFF}$ figure merit of PCM switches compared to FET switches is especially useful in high-frequency RF switch circuits, including upper mmWave test and measurement circuits and equipment, user equipment (e.g., handsets), and cable TV/Internet modems. For example, FIG. 13 is a graph 1300 showing insertion loss versus frequency for a modeled RF switch circuit based on a PCM switch (graph line 1302) and a measured RF switch circuit based on an SOI FET (graph line 1304). As the graph 1300 indicates, the RF switch circuit based on a PCM switch exhibits far greater bandwidth than the RF switch circuit based on an SOI FET.

Figure 14:
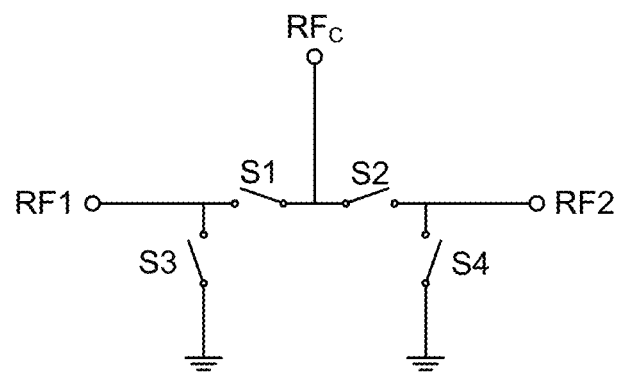
FIG. 14 is a schematic diagram of a two-port RF switch circuit.

PCM switches enable design of SPDT switch circuits with about 1.0 dB loss from DC to about 70 GHz. Such SPDT switch circuits may be beneficially combined to make high performance RF switch circuits. For example, FIG. 14 is a schematic diagram of a two-port RF switch circuit 1400. SPDT switches S1-S4, when suitably set to OPEN or CLOSED states, enable a signal path between a common port RFc and either a first port RF1 or a second port RF2. Each SPDT switch S1-S4 may be a PCM switch, and thus such an RF switch circuit 1400 would exhibit very high bandwidth with little loss.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 15:
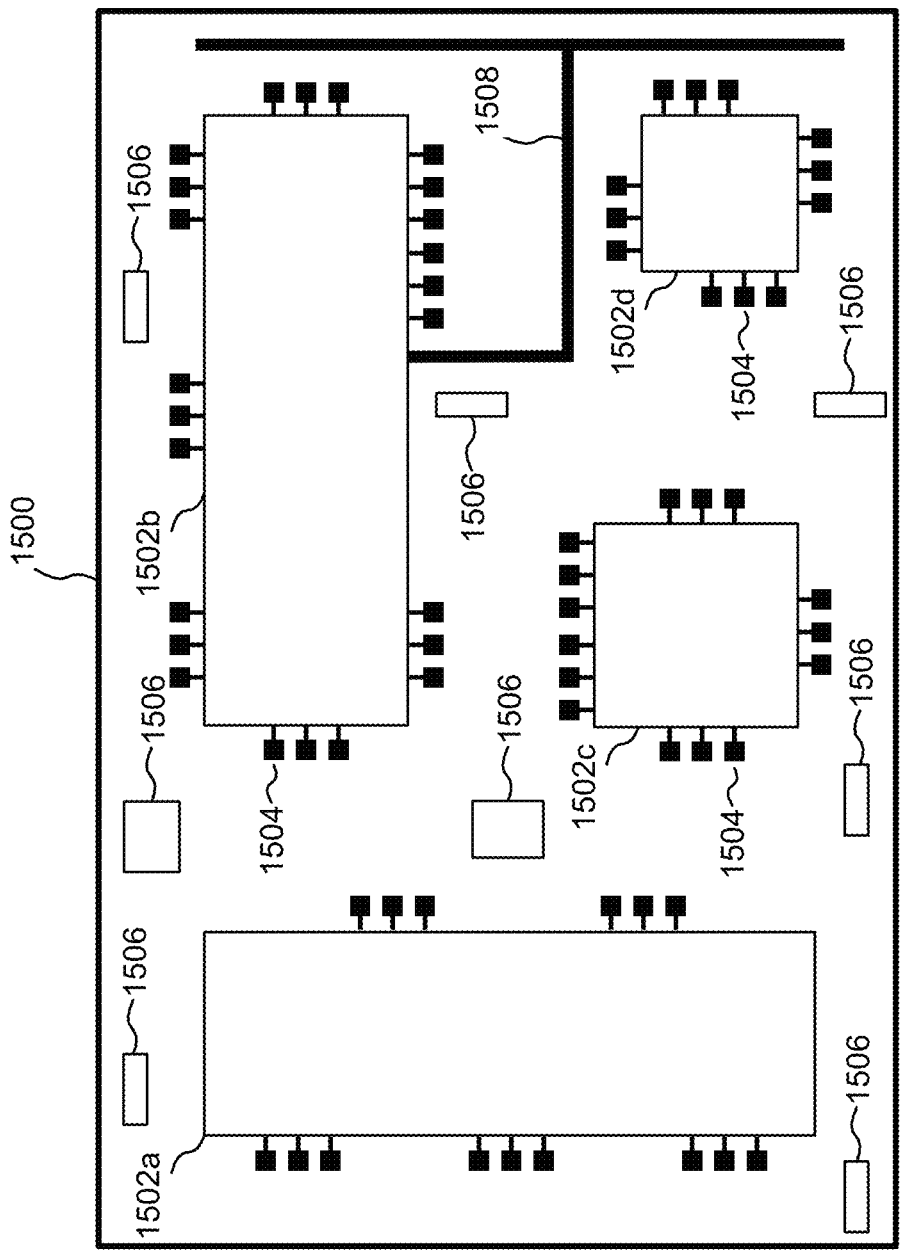
FIG. 15 is a top plan view of a substrate that may be, for example, a printed circuit board or chip module substrate (e.g., a thin-film tile).

As one example of further integration of embodiments of the present invention with other components, FIG. 15 is a top plan view of a substrate 1500 that may be, for example, a printed circuit board or chip module substrate (e.g., a thin-film tile). In the illustrated example, the substrate 1500 includes multiple ICs 1502a-1502d having terminal pads 1504 which would be interconnected by conductive vias and/or traces on and/or within the substrate 1500 or on the opposite (back) surface of the substrate 1500 (to avoid clutter, the surface conductive traces are not shown and not all terminal pads are labelled). The ICs 1502a-1502d may embody, for example, signal switches, active filters, amplifiers (including one or more LNAs), and other circuitry. For example, IC 1502b may incorporate one or more instances of an IC that includes one or more PCM switches in accordance with the present invention.

The substrate 1500 may also include one or more passive devices 1506 embedded in, formed on, and/or affixed to the substrate 1500. While shown as generic rectangles, the passive devices 1506 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 1500 to other passive devices 1506 and/or the individual ICs 1502a-1502d.

The front or back surface of the substrate 1500 may be used as a location for the formation of other structures. For example, one or more antennae may be formed on or affixed to the front or back surface of the substrate 1500; one example of a front-surface antenna 1508 is shown, coupled to an IC die 1502b, which may include RF front-end circuitry. Thus, by including one or more antennae on the substrate 1500, a complete radio may be created.

Note that in some applications, it may be beneficial to utilize parasitic capacitances and/or inductances (at least in part) in implementing effective compensating capacitances or inductances. Thus, while it may be desirable to reduce or cancel such parasitic capacitances and/or inductances in some portions of a circuit, in other portions of the circuit it may be useful to take advantage of the existence of such parasitic capacitances and/or inductances to provide desired functionality and/or reduce the size and/or number of designed-in capacitances and/or inductances.

System Aspects

Embodiments of the present invention are useful in a wide variety of larger radio frequency (RF) circuits and systems for performing a range of functions. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be), as well as other radio communication standards and protocols.

Figure 16:
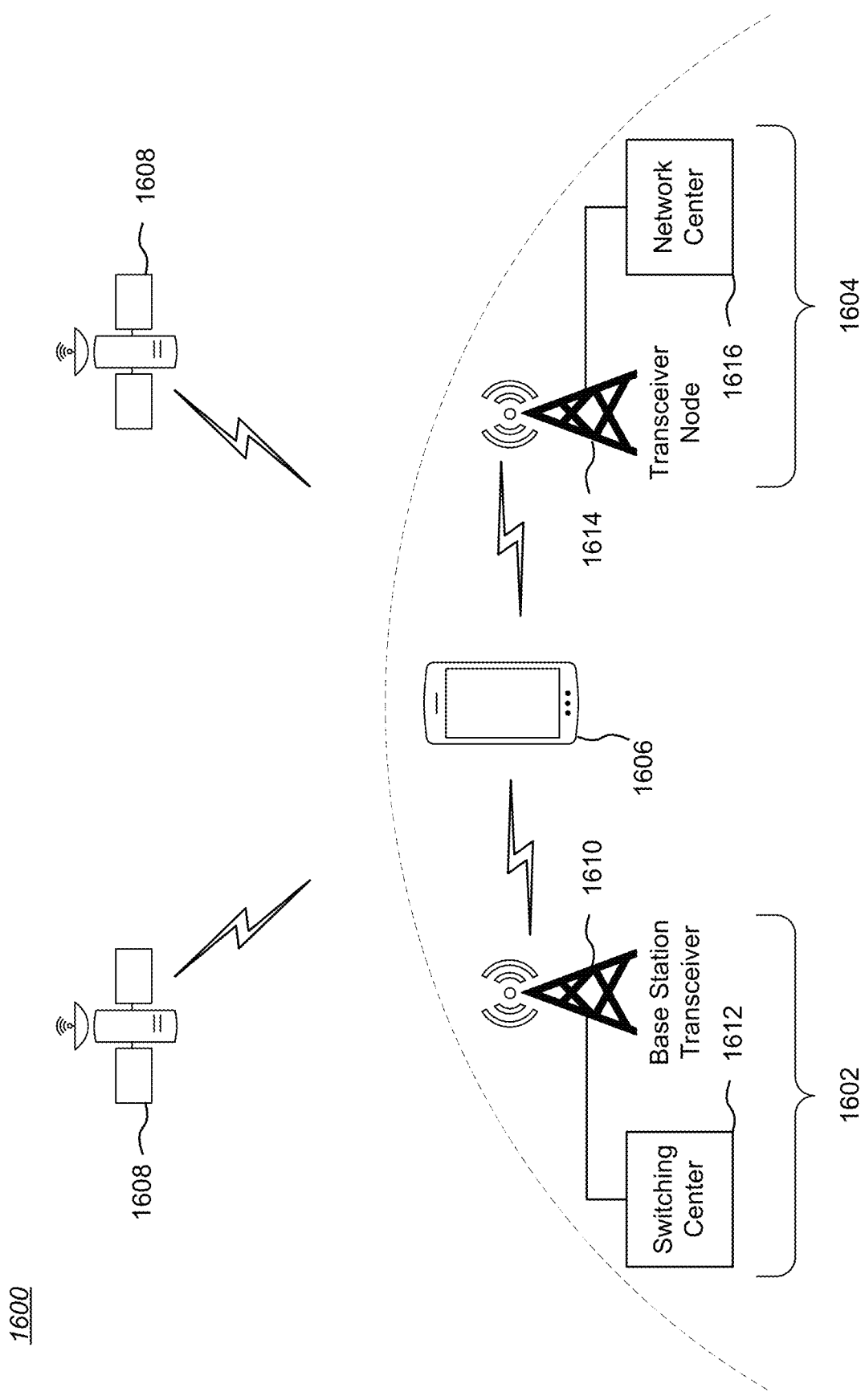
FIG. 16 illustrates an exemplary prior art wireless communication environment comprising different wireless communication systems, and which may include one or more mobile wireless devices.

As an example of wireless RF system usage, FIG. 16 illustrates an exemplary prior art wireless communication environment 1600 comprising different wireless communication systems 1602 and 1604, and which may include one or more mobile wireless devices 1606.

A wireless device 1606 may be capable of communicating with multiple wireless communication systems 1602, 1604 using one or more of the telecommunication protocols noted above. A wireless device 1606 also may be capable of communicating with one or more satellites 1608, such as navigation satellites (e.g., GPS) and/or telecommunication satellites. The wireless device 1606 may be equipped with multiple antennas, externally and/or internally, for operation on different frequencies and/or to provide diversity against deleterious path effects such as fading and multi-path interference. A wireless device 1606 may be a cellular phone, a personal digital assistant (PDA), a wireless-enabled computer or tablet, or some other wireless communication unit or device. A wireless device 1606 may also be referred to as a mobile station, user equipment, an access terminal, or some other terminology.

The wireless system 1602 may be, for example, a CDMA-based system that includes one or more base station transceivers (BSTs) 1610 and at least one switching center (SC) 1612. Each BST 1610 provides over-the-air RF communication for wireless devices 1606 within its coverage area. The SC 1612 couples to one or more BSTs in the wireless system 1602 and provides coordination and control for those BSTs.

The wireless system 1604 may be, for example, a TDMA-based system that includes one or more transceiver nodes 1614 and a network center (NC) 1616. Each transceiver node 1614 provides over-the-air RF communication for wireless devices 1606 within its coverage area. The NC 1616 couples to one or more transceiver nodes 1614 in the wireless system 1604 and provides coordination and control for those transceiver nodes 1614.

In general, each BST 1610 and transceiver node 1614 is a fixed station that provides communication coverage for wireless devices 1606, and may also be referred to as base stations or some other terminology. The SC 1612 and the NC 1616 are network entities that provide coordination and control for the base stations and may also be referred to by other terminologies.

Figure 17:
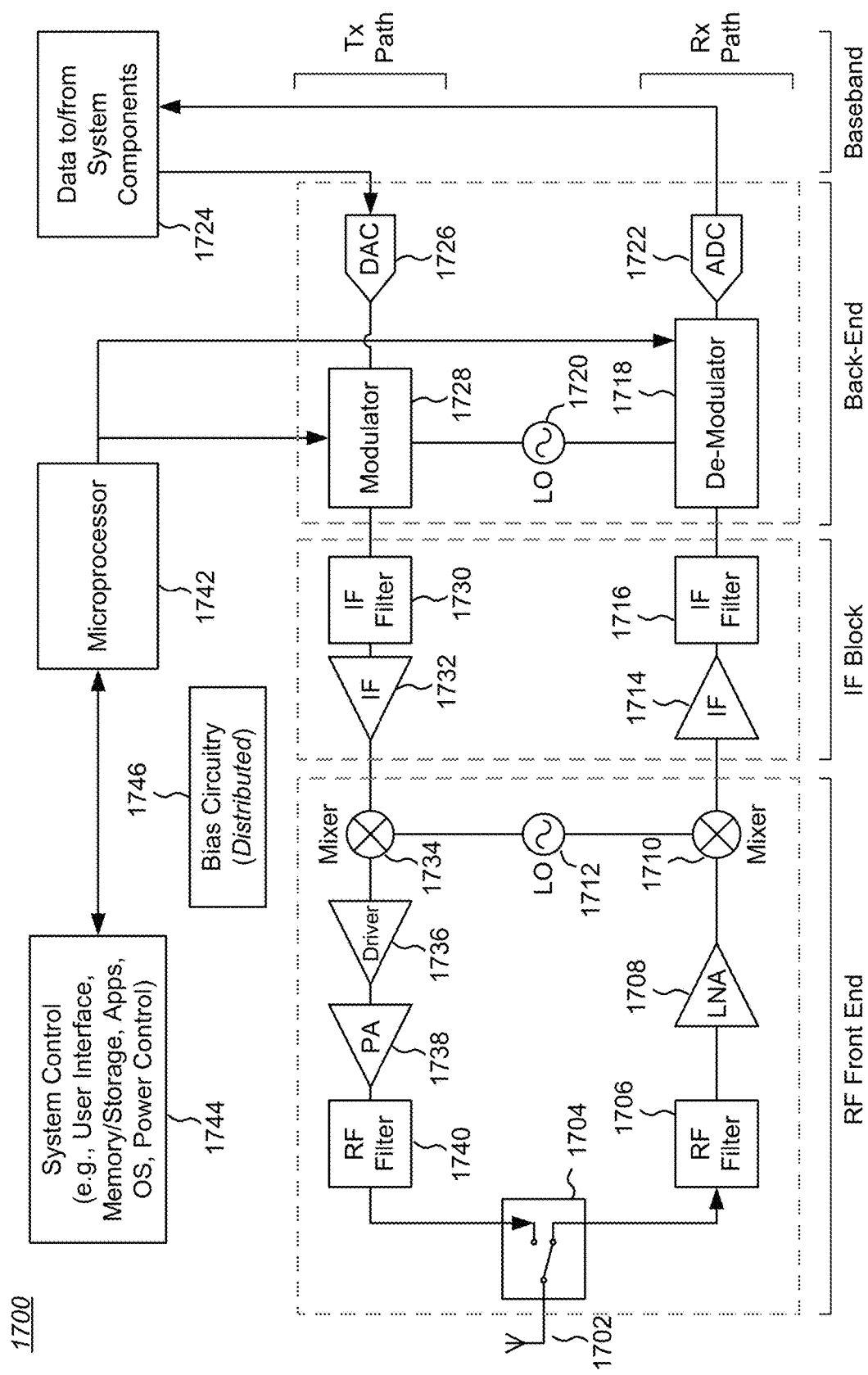
FIG. 17 is a block diagram of a transceiver that might be used in a wireless device, such as a cellular telephone, and which may beneficially incorporate an embodiment of the present invention for improved performance (e.g., high bandwidth).

An important aspect of any wireless system, including the systems shown in FIG. 16, is in the details of how the component elements of the system perform. FIG. 17 is a block diagram of a transceiver 1700 that might be used in a wireless device, such as a cellular telephone, and which may beneficially incorporate an embodiment of the present invention for improved performance (e.g., high bandwidth). As illustrated, the transceiver 1700 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 1702 and a switching unit 1704, which may be implemented with active switching devices (e.g., field effect transistors or FETs), or with passive devices that implement frequency-domain multiplexing, such as a diplexer or duplexer. An RF filter 1706 passes desired received RF signals to a low noise amplifier (LNA) 1708, the output of which is combined in a mixer 1710 with the output of a first local oscillator 1712 to produce an intermediate frequency (IF) signal. The IF signal may be amplified by an IF amplifier 1714 and subjected to an IF filter 1716 before being applied to a demodulator 1718, which may be coupled to a second local oscillator 1720. The demodulated output of the demodulator 1718 is transformed to a digital signal by an analog-to-digital converter 1722 and provided to one or more system components 1724 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1724 is transformed to an analog signal by a digital-to-analog converter 1726, the output of which is applied to a modulator 1728, which also may be coupled to the second local oscillator 1720. The modulated output of the modulator 1728 may be subjected to an IF filter 1730 before being amplified by an IF amplifier 1732. The output of the IF amplifier 1732 is then combined in a mixer 1734 with the output of the first local oscillator 1712 to produce an RF signal. The RF signal may be amplified by a driver 1736, the output of which is applied to a power amplifier (PA) 1738. The amplified RF signal may be coupled to an RF filter 1740, the output of which is coupled to the antenna 1702 through the switching unit 1704.

The operation of the transceiver 1700 is controlled by a microprocessor 1742 in known fashion, which interacts with system control components (e.g., user interfaces, memory/storage devices, application programs, operating system software, power control, etc.). In addition, the transceiver 1700 will generally include other circuitry, such as bias circuitry 1746 (which may be distributed throughout the transceiver 1700 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1700 may be positioned in a different order (e.g., filters) or omitted. Other components can be (and usually are) added (e.g., additional filters, impedance matching networks, variable phase shifters/attenuators, power dividers, etc.).

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A method of countering variations in resistance of a resistive heater of a phase change material (PCM) switch, including:
   (a) measuring a resistance $R_{H\_M}$ of the resistive heater;
   (b) calculating scaled current, voltage, and/or time values as a function of the measured resistance $R_{H\_M}$ and a reference resistance $R_{H\_REF}$;
   (c) calculating an adjusted electrical pulse profile based on the calculated scaled values; and
   (d) applying the adjusted electrical pulse profile to the resistive heater.

2. The method of claim 1, wherein calculating scaled current, voltage, and/or time values includes calculating at least one of a scaled current $I_S$ or a scaled voltage $V_S$ using a corresponding one of the following formulas:

$$I_S = \text{sqrt}(R_{H\_REF}/R_{H\_M}) * I_{S\_REF}$$

$$V_S = \text{sqrt}(R_{H\_M}/R_{H\_REF}) * V_{S\_REF}$$

where $I_{S\_REF}$ is a reference current amplitude of an electrical pulse for inducing an ON or an OFF state for the PCM switch, $V_{S\_REF}$ is a reference voltage amplitude of an electrical pulse for inducing an ON or an OFF state for the PCM switch, and the subscript "S" indicates either an ON state or an OFF state.

3. The method of claim 1, wherein calculating scaled current, voltage, and/or time values includes calculating a scaled current $I_S$ using the following formula:

$$I_S = \mathrm{sqrt}(R_{H\_REF}/R_{H\_M}) * I_{S\_REF}$$

where $I_{S\_REF}$ is a reference current amplitude of an electrical pulse for inducing an ON or an OFF state for the PCM switch, and the subscript "S" indicates either an ON state or an OFF state.

4. The method of claim 1, wherein calculating scaled current, voltage, and/or time values includes calculating a scaled voltage $V_S$ using the following formula:

$$V_S = \mathrm{sqrt}(R_{H\_M}/R_{H\_REF}) * V_{S\_REF}$$

where $V_{S\_REF}$ is a reference voltage amplitude of an electrical pulse for inducing an ON or an OFF state for the PCM switch, and the subscript "S" indicates either an ON state or an OFF state.

5. The method of claim 1, wherein calculating scaled current, voltage, and/or time values includes calculating a scaled time $T_{S\_I}$ using the following formula:

$$T_{S\_I} = (R_{H\_REF}/R_{H\_M}) * T_{S\_REF}$$

where $T_{S\_REF}$ is a reference time duration of an electrical pulse for inducing an ON or an OFF state for the PCM switch, and the subscript "S" indicates either an ON state or an OFF state.

6. The method of claim 1, wherein calculating scaled current, voltage, and/or time values includes calculating a scaled time $T_{S\_V}$ using the following formula:

$$T_{S\_V} = (R_{H\_M}/R_{H\_REF}) * T_{S\_REF}$$

where $T_{S\_REF}$ is a reference time duration of an electrical pulse for inducing an ON or an OFF state for the PCM switch, and the subscript "S" indicates either an ON state or an OFF state.

7. The method of claim 1, further including measuring the resistance $R_{H\_M}$ of the resistive heater when the PCM switch changes states from ON to OFF or from OFF to ON.

8. The method of claim 1, wherein the PCM switch is embodied in an integrated circuit, and further including measuring the resistance $R_{H\_M}$ of the resistive heater after power is applied to the integrated circuit.

9. The method of claim 1, wherein the PCM switch is embodied in an integrated circuit, and measuring includes measuring a resistance $R_{H\_M}$ of a replica resistive heater fabricated to have the same characteristics as the resistive heater of the PCM switch.

10. The method of claim 1, wherein the PCM switch is embodied in an integrated circuit, and further including measuring the resistance $R_{H\_M}$ during testing of the integrated circuit and storing the resulting measurement within the integrated circuit for use in the steps of calculating.

11. The method of claim 1, further including reducing parasitic capacitance caused by the proximity of the resistive heater to a PCM region of the PCM switch, including:
(a) coupling a first switch to a first terminal of the resistive heater;
(b) coupling a second switch to a second terminal of the resistive heater; and
(c) closing the first and second switches while an electrical pulse profile is to be applied to the resistive heater, and opening the first and second switches while the electrical pulse profile is not to be applied to the resistive heater.

12. A circuit for countering variations in resistance of a resistive heater of a phase change material (PCM) switch, including:

(a) a resistivity sensor for measuring a resistance $R_{H\_M}$ of the resistive heater;
(b) a processor, coupled to the resistivity sensor, for calculating scaled current, voltage, and/or time values as a function of the measured resistance $R_{H\_M}$ and a reference resistance $R_{H\_REF}$, for calculating an adjusted electrical pulse profile based on the calculated scaled values, and for outputting signals indicative of the adjusted electrical pulse profile; and
(c) a heater controller and driver, coupled to the processor and the resistive heater, for applying the adjusted electrical pulse profile to the resistive heater.

13. The invention of claim 12, wherein the processor includes a lookup table for storing at least the reference resistance $R_{H\_REF}$.

14. The invention of claim 12, further including a look-up table, coupled to the processor, for storing at least the reference resistance $R_{H\_REF}$.

15. The invention of claim 12, wherein the resistivity sensor is configured to measure a voltage across the resistive heater when a known current is applied to the resistive heater.

16. The invention of claim 12, wherein the resistivity sensor is configured to measure a current through the resistive heater when a known voltage is applied to the resistive heater.

17. The invention of claim 12, wherein the processor is configured to calculate at least one of a scaled current $I_S$ or a scaled voltage $V_S$ using a corresponding one of the following formulas:

$$I_S = \mathrm{sqrt}(R_{H\_REF}/R_{H\_M}) * I_{S\_REF}$$

$$V_S = \mathrm{sqrt}(R_{H\_M}/R_{H\_REF}) * V_{S\_REF}$$

where $I_{S\_REF}$ is a reference current amplitude of an electrical pulse for inducing an ON or an OFF state for the PCM switch, $V_{S\_REF}$ is a reference voltage amplitude of an electrical pulse for inducing an ON or an OFF state for the PCM switch, and the subscript "S" indicates either an ON state or an OFF state.

18. The invention of claim 12, wherein the processor is configured to calculate a scaled current $I_S$ using the following formula:

$$I_S = \mathrm{sqrt}(R_{H\_REF}/R_{H\_M}) * I_{S\_REF}$$

where $I_{S\_REF}$ is a reference current amplitude of an electrical pulse for inducing an ON or an OFF state for the PCM switch, and the subscript "S" indicates either an ON state or an OFF state.

19. The invention of claim 12, wherein the processor is configured to calculate a scaled voltage $V_S$ using the following formula:

$$V_S = \mathrm{sqrt}(R_{H\_M}/R_{H\_REF}) * V_{S\_REF}$$

where $V_{S\_REF}$ is a reference voltage amplitude of an electrical pulse for inducing an ON or an OFF state for the PCM switch, and the subscript "S" indicates either an ON state or an OFF state.

20. The invention of claim 12, wherein the processor is configured to calculate a scaled time $T_{S\_I}$ using the following formula:

$$T_{S\_I} = (R_{H\_REF}/R_{H\_M}) * T_{S\_REF}$$

where $T_{S\_REF}$ is a reference time duration of an electrical pulse for inducing an ON or an OFF state for the PCM switch, and the subscript "S" indicates either an ON state or an OFF state.

21. The invention of claim 12, wherein the processor is configured to calculate a scaled time $T_{S\_V}$ using the following formula:

$$T_{S\_V} = (R_{H\_M}/R_{H\_REF}) * T_{S\_REF}$$

where $T_{S\_REF}$ is a reference time duration of an electrical pulse for inducing an ON or an OFF state for the PCM switch, and the subscript "S" indicates either an ON state or an OFF state.

22. The invention of claim 12, wherein the resistive heater includes a first terminal and a second terminal, and further including:
    (a) a first switch coupled to the first terminal of the resistive heater; and
    (b) a second switch coupled to the second terminal of the resistive heater;
    wherein the first and second switches are configured to be closed while an electrical pulse profile is to be applied to the resistive heater, and open while the electrical pulse profile is not to be applied to the resistive heater.

23. The invention of claim 12, wherein the resistive heater includes a first terminal and a second terminal, and further including:
    (a) a first inductor coupled to the first terminal of the resistive heater; and
    (b) a second inductor coupled to the second terminal of the resistive heater.

\* \* \* \* \*